United States Patent
Song

(10) Patent No.: US 9,704,583 B2
(45) Date of Patent: Jul. 11, 2017

(54) MEMORY SYSTEM AND OPERATING METHOD THEREOF

(71) Applicant: SK hynix Inc., Gyeonggi-do (KR)

(72) Inventor: Min-O Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 43 days.

(21) Appl. No.: 14/856,221

(22) Filed: Sep. 16, 2015

(65) Prior Publication Data
US 2016/0313931 A1    Oct. 27, 2016

(30) Foreign Application Priority Data

Apr. 27, 2015  (KR) .................. 10-2015-0059056

(51) Int. Cl.
| | | |
|---|---|---|
| *G06F 12/00* | (2006.01) | |
| *G11C 16/10* | (2006.01) | |
| *G11C 16/04* | (2006.01) | |
| *G06F 3/06* | (2006.01) | |

(52) U.S. Cl.
CPC .......... *G11C 16/10* (2013.01); *G11C 16/0483* (2013.01); *G06F 3/0647* (2013.01)

(58) Field of Classification Search
None
See application file for complete search history.

(56) References Cited

U.S. PATENT DOCUMENTS

| | | | | |
|---|---|---|---|---|
| 6,718,445 B1* | 4/2004 | Lewis | ................... | G06F 12/126 710/56 |
| 7,403,187 B2* | 7/2008 | Hewlett | ................. | G09G 3/346 345/108 |
| 8,132,045 B2* | 3/2012 | Avila | .................... | G06F 11/141 711/103 |
| 8,832,353 B2* | 9/2014 | Hsu | ..................... | G06F 12/0246 711/103 |
| 2007/0014153 A1* | 1/2007 | Gorobets | ............ | G11C 11/5628 365/185.12 |
| 2007/0064007 A1* | 3/2007 | Childers | ................ | G09G 3/346 345/589 |
| 2010/0257308 A1* | 10/2010 | Hsu | ..................... | G06F 12/0246 711/103 |

FOREIGN PATENT DOCUMENTS

| | | |
|---|---|---|
| KR | 1020070122208 | 12/2007 |
| KR | 1020110094640 | 8/2011 |
| KR | 1020140092750 | 7/2014 |

* cited by examiner

*Primary Examiner* — Brian Peugh
(74) *Attorney, Agent, or Firm* — IP & T Group LLP

(57) ABSTRACT

A memory system includes a memory device including a plurality of memory chips, each of which includes a plurality of planes suitable for storing data and a plurality of page buffers respectively corresponding to the planes; and a controller suitable for transferring write data stored in a write buffer thereof to a first page buffer of a first chip, releasing the write buffer and a first plane corresponding to the first page buffer in the first chip after the transfer to the first page buffer, and programming the write data in the first planes after the release from the first plane.

20 Claims, 12 Drawing Sheets

MEMORY SYSTEM AND OPERATING METHOD THEREOF

CROSS-REFERENCE TO RELATED APPLICATION

This application claims priority under 35 U.S.C. §119 to Korean Patent Application No. 10-2015-0059056 filed on Apr. 27, 2015 in the Korean Intellectual Property Office, the disclosure of which is incorporated herein by reference in its entirety.

TECHNICAL FIELD

Exemplary embodiments relate to a memory system, and more particularly, to a memory system which processes data from a memory device, and an operating method thereof.

DISCUSSION OF THE RELATED ART

The computer environment paradigm has shifted to ubiquitous computing systems that can be used anytime and anywhere. Due to this fact, the use of portable electronic devices such as mobile phones, digital cameras, and notebook computers has rapidly increased. These portable electronic devices generally use a memory system having memory devices, that is, a data storage device. The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

SUMMARY

Various embodiments are directed to a memory system capable of maximizing the efficiency of memory device usage for quick and stable data processing, and an operating method thereof.

In an embodiment, a memory system may include: a memory device including a plurality of memory chips, each of which includes a plurality of planes suitable for storing data and a plurality of page buffers respectively corresponding to the plural planes; and a controller suitable for transferring a write data stored in a write buffer thereof to a first page buffer of a first chip, releasing the write buffer and a first plane corresponding the first page buffer in the first chip after the transfer to the first page buffer, and programming the write data in the first planes after the release from the first plane.

When the programming in the first chip fails, the controller may further rejoin the write buffer and the first plane, and transfer the write data to a second page buffer of a second chip.

The controller may further release the write buffer a second plane corresponding the second page buffer in the second chip after the transfer to the second page buffer, and program the write data in the second planes after the release from the second plane.

The first plane may include a least significant bit (LSB) plane and a most significant bit (MSB) plane.

The controller may program the write data through one or more of a one shot program, a multi-plane program and a one plane program.

In an embodiment, a memory system may include: a memory device including a plurality of memory chips, each of which includes a plurality of planes suitable for storing data and a plurality of page buffers respectively corresponding to the plural planes; and a controller suitable for sequentially transferring a plurality of data chunks, which are included in a write data and respectively stored in corresponding regions of a write buffer thereof, to first one of the plural page buffers of first one of the plural chips, releasing the corresponding region of the write buffer and first one of the plural planes corresponding the first page buffer in the first chip after each transfer of the plural data chunks to the first page buffer, and programming the write data in the first planes after the release from the first plane.

When programming a first one of the plural data chunks in the first chip fails, the controller may rejoin the first plane and a first region of the write buffer corresponding to the first data chunk, and transfer the first data chunk to second one of the plural page buffers of second one of the plural chips.

The controller may further release the first region and second one of the plural planes corresponding the second page buffer in the second chip after the transfer of the first data chunk to the second page buffer, and program the first data chunk in the second planes after the release of the first region from the second plane.

The first plane may include a least significant bit (LSB) plane and a most significant bit (MSB) plane.

The controller may program the write data through one or more of a one shot program, a multi-plane program and a one plane program.

In an embodiment, a method for operating a memory system including a plurality of memory chips, each of which includes a plurality of planes suitable for storing data, a plurality of page buffers respectively corresponding to the plural planes, and a write buffer, may include: transferring a write data stored in the write buffer to first one of the plural page buffers of first one of the plural chips; releasing the write buffer and first one of the plural planes corresponding the first page buffer in the first chip after the transfer to the first page buffer; and programming the write data in the first planes after the release from the first plane.

The method may further include when the programming in the first chip fails: rejoining the write buffer and the first plane; and transferring the write data to second one of the plural page buffers of second one of the plural chips.

The method may further include: releasing the write buffer and second one of the plural planes corresponding the second page buffer in the second chip after the transfer to the second page buffer; and programming the write data in the second planes after the release from the second plane.

The first plane may include a least significant bit (LSB) plane and a most significant bit (MSB) plane.

The programming may be performed through one or more of a one shot program, a multi-plane program and a one plane program.

In an embodiment, a method for operating a memory system including a plurality of memory chips, each of which includes a plurality of planes suitable for storing data, a plurality of page buffers respectively corresponding to the plural planes, and a write buffer, the method may include: sequentially transferring a plurality of data chunks, which are included in the write data and respectively stored in corresponding regions of the write buffer, to first one of the plural page buffers of first one of the plural chips; releasing the corresponding region of the write buffer and first one of the plural planes corresponding the first page buffer in the first chip after each transfer of the plural data chunks to the first page buffer; and programming the write data in the first planes after the release from the first plane.

The method may further include when the programming a first one of the plural data chunks in the first chip fails: rejoining the first plane and a first region of the write buffer corresponding to the first data chunk; and transferring the first data chunk to second one of the plural page buffers of second one of the plural chips.

The method may further include: releasing the first region and second one of the plural planes corresponding the second page buffer in the second chip after the transfer of the first data chunk to the second page buffer; and programming the first data chunk in the second planes after the release of the first region from the second plane.

The first plane may include a least significant bit (LSB) plane and a most significant bit (MSB) plane.

The programming may be performed through one or more of a one shot program, a multi-plane program and a one plane program.

DETAILED DESCRIPTION

Figure 1:
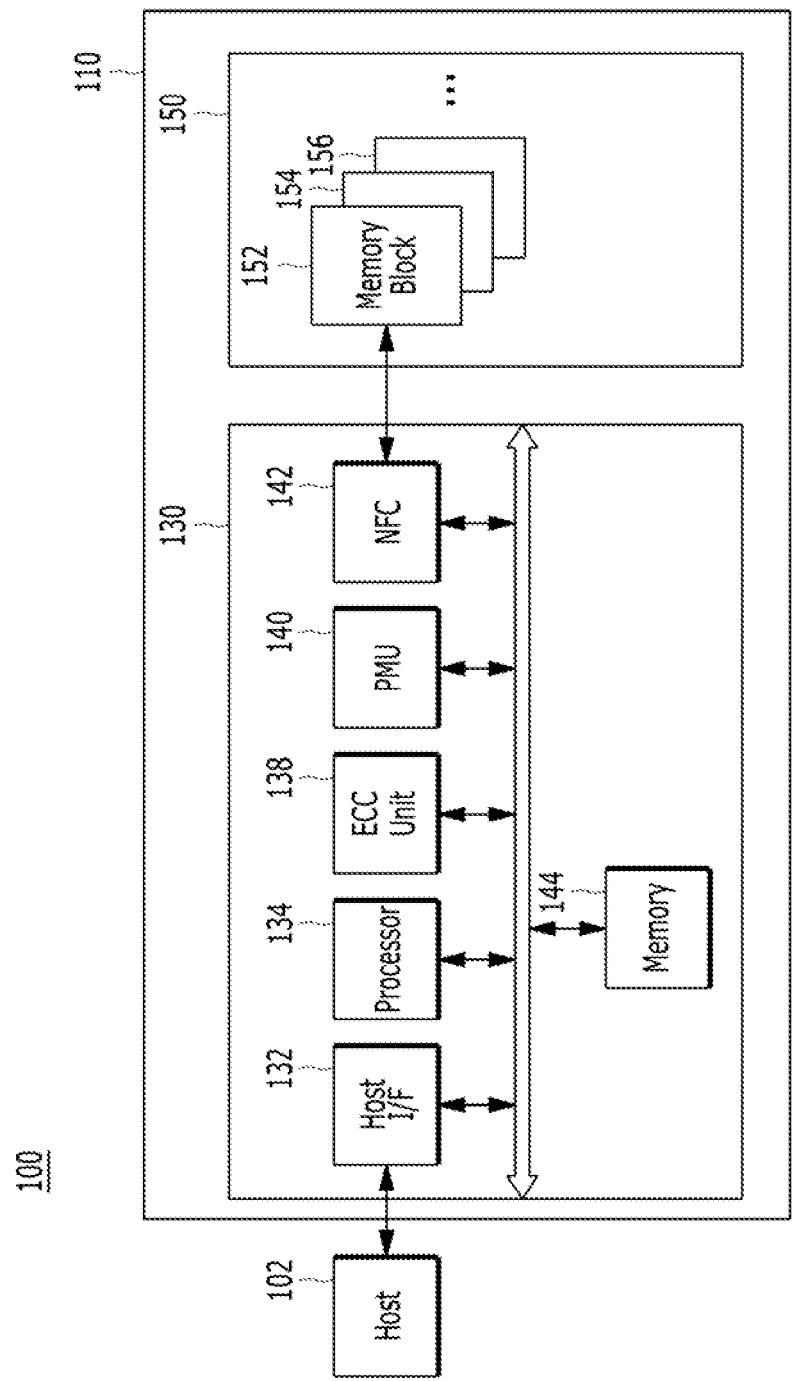
FIG. 1 is a block diagram illustrating a data processing system including a memory system in accordance with an embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a data processing system including a memory system in accordance with an embodiment.

Referring to FIG. 1, a data processing system 100 may include a host 102 and a memory system 110.

The host 102 may include, for example, a portable electronic device such as a mobile phone, an MP3 player and a laptop computer or an electronic device such as a desktop computer, a game player, a TV and a projector.

The memory system 110 may operate in response to a request from the host 102, and in particular, store data to be accessed by the host 102. In other words, the memory system 110 may be used as a main memory system or an auxiliary memory system of the host 102. The memory system 110 may be implemented with any one of various kinds of storage devices, according to the protocol of a host interface to be electrically coupled with the host 102. The memory system 110 may be implemented with any one of various kinds of storage devices such as a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and so forth.

The storage devices for the memory system 110 may be implemented with a volatile memory device such as a dynamic random access memory (DRAM) and a static random access memory (SRAM) or a nonvolatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The memory system 110 may include a memory device 150 which stores data to be accessed by the host 102, and a controller 130 which controls storage of data in the memory device 150.

The controller 130 and the memory device 150 may be integrated into one semiconductor device. For instance, the controller 130 and the memory device 150 may be integrated into one semiconductor device and configure a solid state drive (SSD). When the memory system 110 is used as the SSD, the operation speed of the host 102 that is electrically coupled with the memory system 110 may be significantly increased.

The controller 130 and the memory device 150 may be integrated into one semiconductor device and configure a memory card. The controller 130 and the memory card 150 may be integrated into one semiconductor device and configure a memory card such as a Personal Computer Memory Card International Association (PCMCIA) card, a compact flash (CF) card, a smart media (SM) card (SMC), a memory stick, a multimedia card (MMC), an RS-MMC and a micro-MMC, a secure digital (SD) card, a mini-SD, a micro-SD and an SDHC, and a universal flash storage (UFS) device.

For another instance, the memory system 110 may configure a computer, an ultra mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, an RFID device, or one of various component elements configuring a computing system.

The memory device 150 of the memory system 110 may retain stored data when power supply is interrupted and, in particular, store the data provided from the host 102 during a write operation, and provide stored data to the host 102 during a read operation. The memory device 150 may include a plurality of memory blocks 152, 154 and 156. Each of the memory blocks 152, 154 and 156 may include a plurality of pages. Each of the pages may include a plurality of memory cells to which a plurality of word lines (WL) are electrically coupled. The memory device 150 may be a nonvolatile memory device, for example, a flash memory. The flash memory may have a three-dimensional (3D) stack structure. The structure of the memory device 150 and the three-dimensional (3D) stack structure of the memory device 150 will be described later in detail with reference to FIGS. 2 to 11.

The controller 130 of the memory system 110 may control the memory device 150 in response to a request from the host 102. The controller 130 may provide the data read from the memory device 150, to the host 102, and store the data provided from the host 102 into the memory device 150. To this end, the controller 130 may control overall operations of the memory device 150, such as read, write, program and erase operations.

In detail, the controller 130 may include a host interface unit 132, a processor 134, an error correction code (ECC) unit 138, a power management unit 140, a NAND flash controller 142, and a memory 144.

The host interface unit 132 may process commands and data provided from the host 102, and may communicate with the host 102 through at least one of various interface protocols such as universal serial bus (USB), multimedia card (MMC), peripheral component interconnect-express (PCI-E), serial attached SCSI (SAS), serial advanced technology attachment (SATA), parallel advanced technology attachment (DATA), small computer system interface (SCSI), enhanced small disk interface (ESDI), and integrated drive electronics (IDE).

The ECC unit 138 may detect and correct errors in the data read from the memory device 150 during the read operation. The ECC unit 138 may not correct error bits when the number of the error bits is greater than or equal to a threshold number of correctable error bits, and may output an error correction fail signal indicating failure in correcting the error bits.

The ECC unit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all circuits, systems or devices for the error correction operation.

The PMU 140 may provide and manage power for the controller 130, that is, power for the component elements included in the controller 130.

The NFC 142 may serve as a memory interface between the controller 130 and the memory device 150 to allow the controller 130 to control the memory device 150 in response to a request from the host 102. The NFC 142 may generate control signals for the memory device 150 and process data under the control of the processor 134 when the memory device 150 is a flash memory and, in particular, when the memory device 150 is a NAND flash memory.

The memory 144 may serve as a working memory of the memory system 110 and the controller 130, and store data for driving the memory system 110 and the controller 130. The controller 130 may control the memory device 150 in response to a request from the host 102. For example, the controller 130 may provide the data read from the memory device 150 to the host 102 and store the data provided from the host 102 in the memory device 150. When the controller 130 controls the operations of the memory device 150, the memory 144 may store data used by the controller 130 and the memory device 150 for such operations as read, write, program and erase operations.

The memory 144 may be implemented with volatile memory. The memory 144 may be implemented with a static random access memory (SRAM) or a dynamic random access memory (DRAM). As described above, the memory 144 may store data used by the host 102 and the memory device 150 for the read and write operations. To store the data, the memory 144 may include a program memory, a data memory, a write buffer, a read buffer, a map buffer, and so forth.

The processor 134 may control general operations of the memory system 110, and a write operation or a read operation for the memory device 150, in response to a write request or a read request from the host 102. The processor 134 may drive firmware, which is referred to as a flash translation layer (FTL), to control the general operations of the memory system 110. The processor 134 may be implemented with a microprocessor or a central processing unit (CPU).

A management unit (not shown) may be included in the processor 134, and may perform bad block management of the memory device 150. The management unit may find bad memory blocks included in the memory device 150, which are in unsatisfactory condition for further use, and perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. Also, the bad blocks due to the program fail seriously deteriorates the utilization efficiency of the memory device 150 having a 3D stack structure and the reliability of the memory system 100, and thus reliable bad block management is required.

Figure 2:
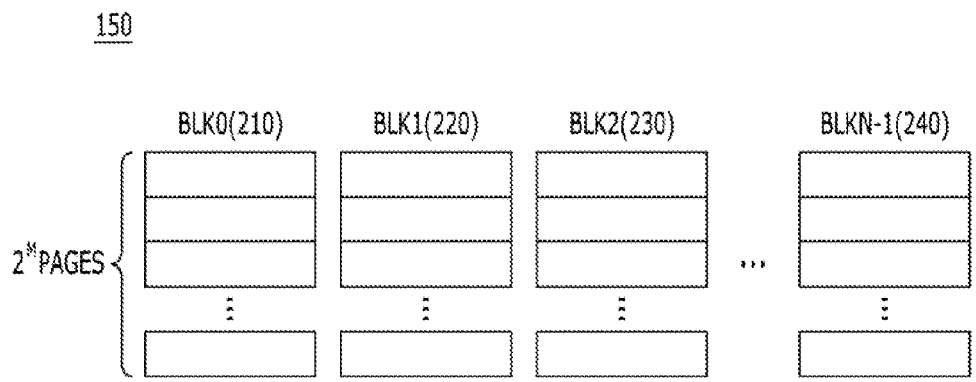
FIG. 2 is a schematic diagram illustrating a memory device shown in FIG. 1.

FIG. 2 is a schematic diagram illustrating the memory device 150 shown in FIG. 1.

Referring to FIG. 2, the memory device 150 may include a plurality of memory blocks, for example, zeroth to (N-1)$^{th}$ blocks 210 to 240. Each of the plurality of memory blocks 210 to 240 may include a plurality of pages, for example, $2^M$ number of pages ($2^M$ PAGES), to which the present invention will not be limited. Each of the plurality of pages may include a plurality of memory cells to which a plurality of word lines are electrically coupled.

Also, the memory device 150 may include a plurality of memory blocks, as single level cell (SLC) memory blocks and multi-level cell (MLC) memory blocks, according to the number of bits which may be stored or expressed in each memory cell. The SLC memory block may include a plurality of pages which are implemented with memory cells each capable of storing 1-bit data. The MLC memory block may include a plurality of pages which are implemented with memory cells each capable of storing multi-bit data, for example, two or more-bit data. An MLC memory block including a plurality of pages which are implemented with memory cells that are each capable of storing 3-bit data may be defined as a triple level cell (TLC) memory block.

Each of the plurality of memory blocks 210 to 240 may store the data provided from the host device 102 during a write operation, and may provide stored data to the host 102 during a read operation.

Figure 3:
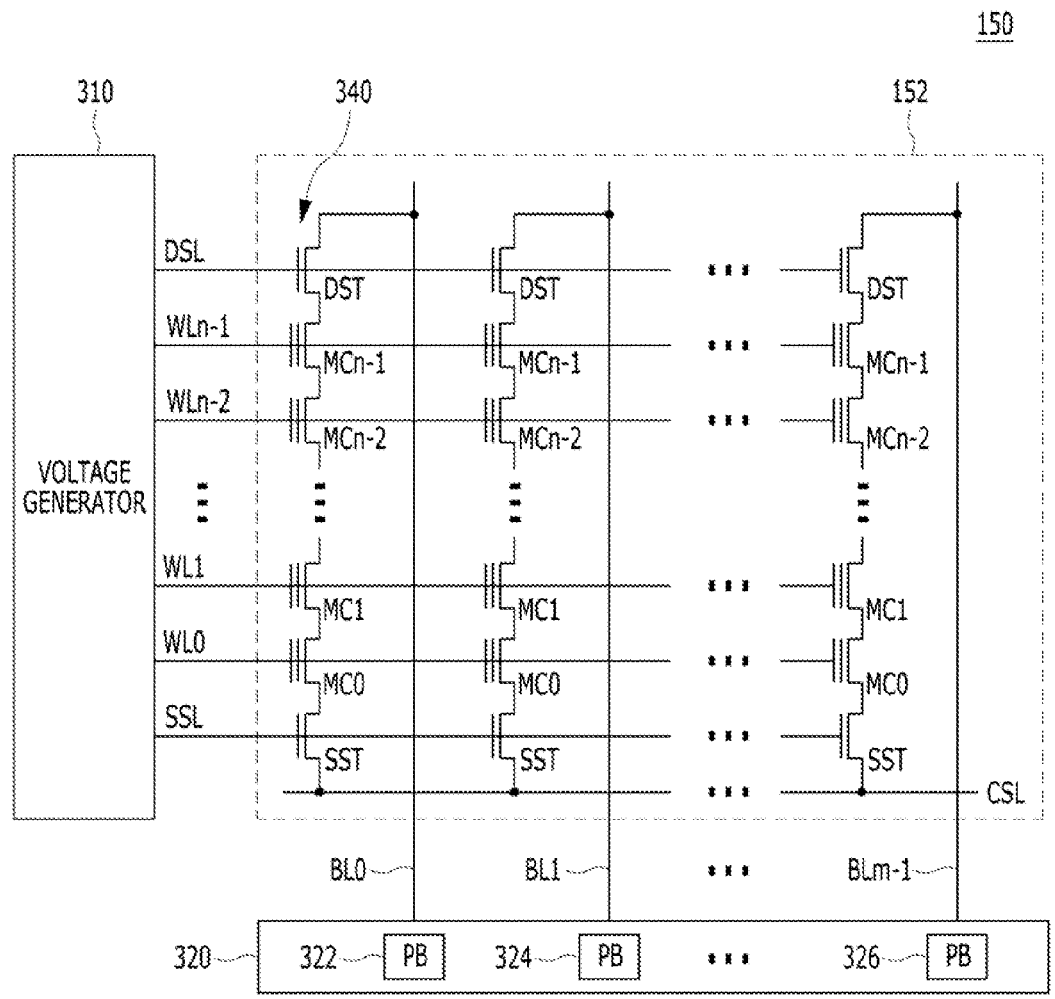
FIG. 3 is a circuit diagram illustrating a memory block shown in FIG. 1.

FIG. 3 is a circuit diagram illustrating one of the plurality of memory blocks 152 to 156 shown in FIG. 1.

Referring to FIG. 3, the memory block 152 of the memory device 150 may include a plurality of cell strings 340 which are electrically coupled to bit lines BL0 to BLm-1, respectively. The cell string 340 of each column may include at least one drain select transistor DST and at least one source select transistor SST. A plurality of memory cells or a plurality of memory cell transistors MC0 to MCn-1 may be electrically coupled in series between the select transistors DST and SST. The respective memory cells MC0 to MCn-1 may be configured by multi-level cells (MLC) each of which stores data information of a plurality of bits. The strings 340 may be electrically coupled to the corresponding bit lines BL0 to BLm-1, respectively. For reference, in FIG. 3, 'DSL' denotes a drain select line, 'SSL' denotes a source select line, and 'CSL' denotes a common source line.

While FIG. 3 shows, as an example, the memory block 152 which is configured by NAND flash memory cells, it is to be noted that the memory block 152 of the memory device 150 in accordance with the embodiment is not limited to NAND flash memory and may be realized by NOR flash memory, hybrid flash memory in which at least two kinds of memory cells are combined, or one-NAND flash memory in which a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

A voltage supply block 310 of the memory device 150 may provide word line voltages, for example, a program voltage, a read voltage and a pass voltage, to be supplied to respective word lines according to an operation mode and voltages to be supplied to bulks, for example, well regions in which the memory cells are formed. The voltage supply block 310 may perform a voltage generating operation under the control of a control circuit (not shown). The voltage supply block 310 may generate a plurality of variable read voltages to generate a plurality of read data, select one of the memory blocks or sectors of a memory cell array under the control of the control circuit, select one of the word lines of the selected memory block, and provide the word line voltages to the selected word line and unselected word lines.

A read/write circuit 320 of the memory device 150 may be controlled by the control circuit, and may serve as a sense amplifier or a write driver according to an operation mode. During a verification/normal read operation, the read/write circuit 320 may serve as a sense amplifier for reading data from the memory cell array. Also, during a program operation, the read/write circuit 320 may serve as a write driver which drives bit lines according to data to be stored in the memory cell array. The read/write circuit 320 may receive data to be written in the memory cell array, from a buffer (not shown), during the program operation, and may drive the bit lines according to the inputted data. To this end, the read/write circuit 320 may include a plurality of page buffers 322, 324 and 326 respectively corresponding to columns (or bit lines) or pairs of columns (or pairs of bit lines), and a plurality of latches (not shown) may be included in each of the page buffers 322, 324 and 326. FIGS. 4 to 11 are schematic diagrams illustrating the memory device 150 shown in FIG. 1.

Figure 4:
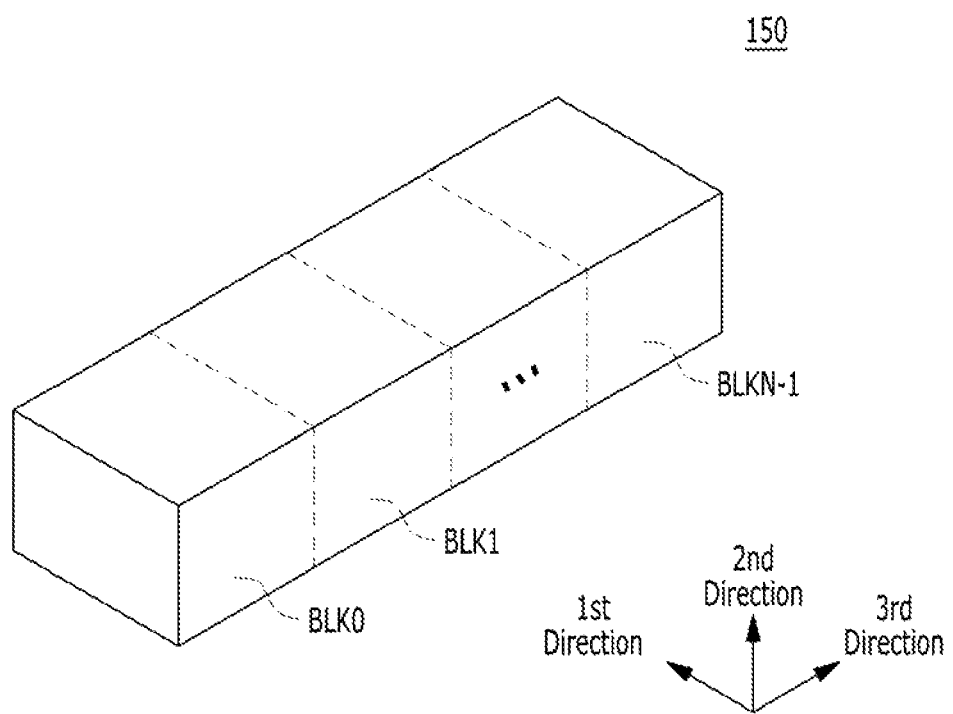
FIGS. 4 to 11 are schematic diagrams illustrating a memory device shown in FIG. 1.

FIG. 4 is a block diagram illustrating an example of the plurality of memory blocks 152 to 156 of the memory device 150 shown in FIG. 1.

Referring to FIG. 4, the memory device 150 may include a plurality of memory blocks BLK0 to BLKN-1, and each of the memory blocks BLK0 to BLKN-1 may be realized in a three-dimensional (3D) structure or a vertical structure. The respective memory blocks BLK0 to BLKN-1 may include structures which extend in first to third directions, for example, an x-axis direction, a y-axis direction and a z-axis direction.

The respective memory blocks BLK0 to BLKN-1 may include a plurality of NAND strings NS which extend in the second direction. The plurality of NAND strings NS may be provided in the first direction and the third direction. Each NAND string NS may be electrically coupled to a bit line BL, at least one source select line SSL, at least one ground select line GSL, a plurality of word lines WL, at least one dummy word line DWL, and a common source line CSL. Namely, the respective memory blocks BLK0 to BLKN-1 may be electrically coupled to a plurality of bit lines BL, a plurality of source select lines SSL, a plurality of ground select lines GSL, a plurality of word lines WL, a plurality of dummy word lines DWL, and a plurality of common source lines CSL.

Figure 5:
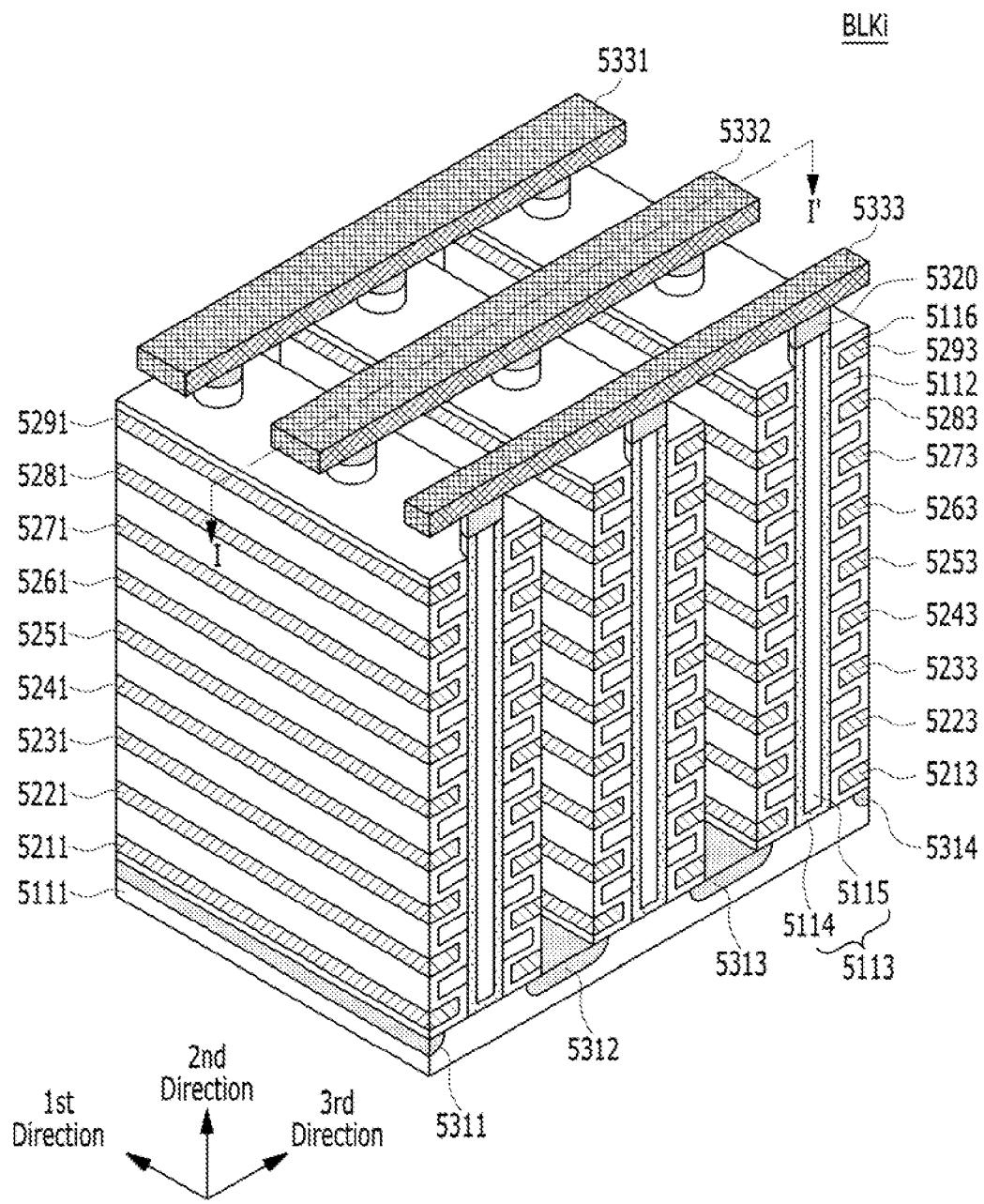
Figure 6:
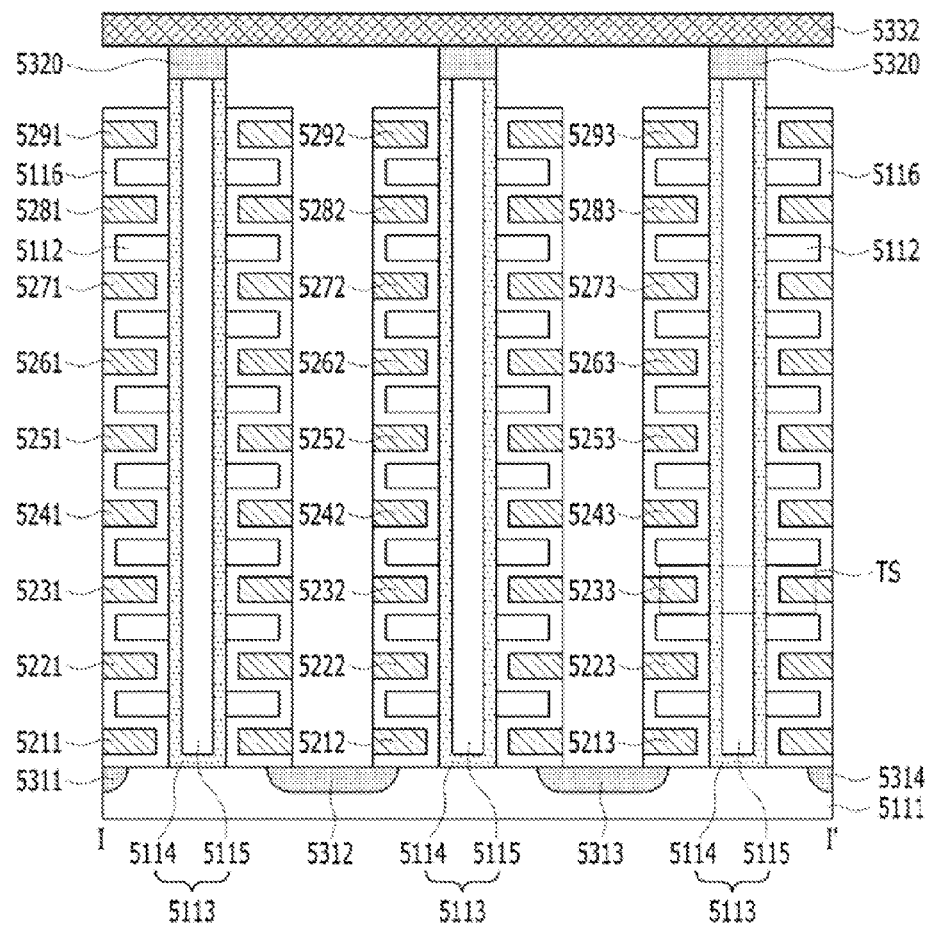

FIG. 5 is a perspective view of one BLKi of the plural memory blocks BLK0 to BLKN-1 shown in FIG. 4. FIG. 6 is a cross-sectional view taken along a line I-I' of the memory block BLKi shown in FIG. 5.

Referring to FIGS. 5 and 6, a memory block BLKi among the plurality of memory blocks of the memory device 150 may include a structure which extends in the first to third directions.

A substrate 5111 may be provided. The substrate 5111 may include a silicon material doped with a first type impurity. The substrate 5111 may include a silicon material doped with a p-type impurity or may be a p-type well, for example, a pocket p-well, and include an n-type well which surrounds the p-type well. While it is assumed in the embodiment for the sake of convenience that the substrate 5111 is p-type silicon, it is to be noted that the substrate 5111 is not limited to being p-type silicon.

A plurality of doping regions 5311 to 5314 which extend in the first direction may be provided over the substrate 5111. The plurality of doping regions 5311 to 5314 may contain a second type of impurity that is different from the substrate 5111. The plurality of doping regions 5311 to 5314 may be doped with an n-type impurity. While it is assumed here that first to fourth doping regions 5311 to 5314 are n-type, it is to be noted that the first to fourth doping regions 5311 to 5314 are not limited to being n-type.

In the region over the substrate 5111 between the first and second doping regions 5311 and 5312, a plurality of dielectric materials 5112 which extend in the first direction may be sequentially provided in the second direction. The dielectric materials 5112 and the substrate 5111 may be separated by a predetermined distance in the second direction. The dielectric materials 5112 may be separated by a predetermined distance in the second direction. The dielectric materials 5112 may include a dielectric material such as silicon oxide.

In the region over the substrate 5111 between the first and second doping regions 5311 and 5312, a plurality of pillars 5113 which are sequentially disposed in the first direction and pass through the dielectric materials 5112 in the second direction may be provided. The plurality of pillars 5113 may respectively pass through the dielectric materials 5112 and may be electrically coupled with the substrate 5111. Each pillar 5113 may be configured by a plurality of materials. The surface layer 5114 of each pillar 5113 may include a silicon material doped with the first type of impurity. The surface layer 5114 of each pillar 5113 may include a silicon material doped with the same type of impurity as the substrate 5111. While it is assumed here that the surface layer 5114 of each pillar 5113 may include p-type silicon, the surface layer 5114 of each pillar 5113 is not limited to being p-type silicon.

An inner layer 5115 of each pillar 5113 may be formed of a dielectric material. The inner layer 5115 of each pillar 5113 may be filled by a dielectric material such as silicon oxide.

In the region between the first and second doping regions 5311 and 5312, a dielectric layer 5116 may be provided along the exposed surfaces of the dielectric materials 5112, the pillars 5113 and the substrate 5111. The thickness of the dielectric layer 5116 may be less than half of the distance between the dielectric materials 5112. In other words, a region in which a material other than the dielectric material 5112 and the dielectric layer 5116 may be disposed, may be provided between (i) the dielectric layer 5116 provided over the bottom surface of a first dielectric material of the dielectric materials 5112 and (ii) the dielectric layer 5116 provided over the top surface of a second dielectric material of the dielectric materials 5112. The dielectric materials 5112 lie below the first dielectric material.

In the region between the first and second doping regions 5311 and 5312, conductive materials 5211 to 5291 may be provided over the exposed surface of the dielectric layer 5116. The conductive material 5211 which extends in the first direction may be provided between the dielectric material 5112 adjacent to the substrate 5111 and the substrate 5111. In particular, the conductive material 5211 which extends in the first direction may be provided between (0 the dielectric layer 5116 disposed over the substrate 5111 and (ii) the dielectric layer 5116 disposed over the bottom surface of the dielectric material 5112 adjacent to the substrate 5111.

The conductive material which extends in the first direction may be provided between (i) the dielectric layer 5116 disposed over the top surface of one of the dielectric materials 5112 and (ii) the dielectric layer 5116 disposed over the bottom surface of another dielectric material of the dielectric materials 5112, which is disposed over the dielectric material 5112. The conductive materials 5221 to 5281 which extend in the first direction may be provided between the dielectric materials 5112. The conductive material 5291 which extends in the first direction may be provided over the uppermost dielectric material 5112. The conductive materials 5211 to 5291 which extend in the first direction may be a metallic material. The conductive materials 5211 to 5291 which extend in the first direction may be a conductive material such as polysilicon.

In the region between the second and third doping regions 5312 and 5313, the same structures as the structures between the first and second doping regions 5311 and 5312 may be provided. For example, in the region between the second and third doping regions 5312 and 5313, the plurality of dielectric materials 5112 which extend in the first direction, the plurality of pillars 5113 which are sequentially arranged in the first direction and pass through the plurality of dielectric materials 5112 in the second direction, the dielectric layer 5116 which is provided over the exposed surfaces of the plurality of dielectric materials 5112 and the plurality of pillars 5113, and the plurality of conductive materials 5212 to 5292 which extend in the first direction may be provided.

In the region between the third and fourth doping regions 5313 and 5314, the same structures as between the first and second doping regions 5311 and 5312 may be provided. For example, in the region between the third and fourth doping regions 5313 and 5314, the plurality of dielectric materials 5112 which extend in the first direction, the plurality of pillars 5113 which are sequentially arranged in the first direction and pass through the plurality of dielectric materials 5112 in the second direction, the dielectric layer 5116 which is provided over the exposed surfaces of the plurality of dielectric materials 5112 and the plurality of pillars 5113, and the plurality of conductive materials 5213 to 5293 which extend in the first direction may be provided.

Drains 5320 may be respectively provided over the plurality of pillars 5113. The drains 5320 may be silicon materials doped with second type impurities. The drains 5320 may be silicon materials doped with n-type impurities. While it is assumed for the sake of convenience that the drains 5320 include n-type silicon, it is to be noted that the drains 5320 are not limited to being n-type silicon. For example, the width of each drain 5320 may be larger than the width of each corresponding pillar 5113. Each drain 5320 may be provided in the shape of a pad over the top surface of each corresponding pillar 5113.

Conductive materials 5331 to 5333 which extend in the third direction may be provided over the drains 5320. The conductive materials 5331 to 5333 may be sequentially disposed in the first direction. The respective conductive materials 5331 to 5333 may be electrically coupled with the drains 5320 of corresponding regions. The drains 5320 and the conductive materials 5331 to 5333 which extend in the third direction may be electrically coupled with through contact plugs. The conductive materials 5331 to 5333 which extend in the third direction may be a metallic material. The conductive materials 5331 to 5333 which extend in the third direction may be a conductive material such as polysilicon.

In FIGS. 5 and 6, the respective pillars 5113 may form strings together with the dielectric layer 5116 and the conductive materials 5211 to 5291, 5212 to 5292 and 5213 to 5293 which extend in the first direction. The respective pillars 5113 may form NAND strings NS together with the dielectric layer 5116 and the conductive materials 5211 to 5291, 5212 to 5292 and 5213 to 5293 which extend in the first direction. Each NAND string NS may include a plurality of transistor structures TS.

Figure 7:
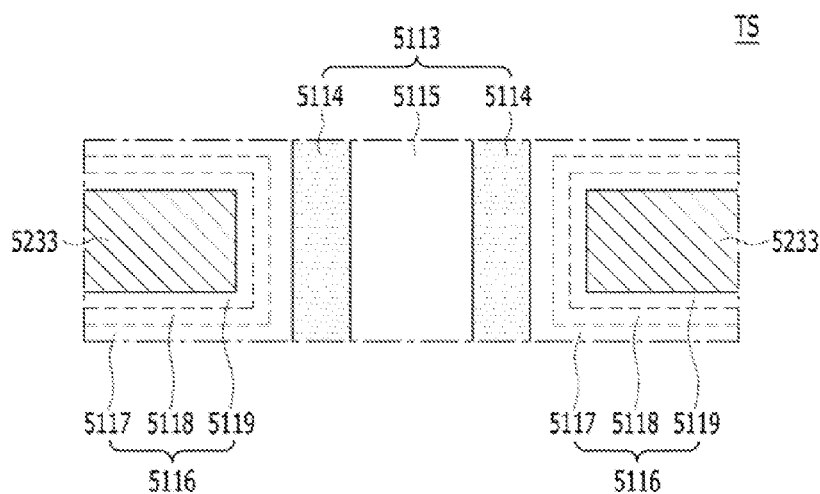

FIG. 7 is a cross-sectional view of the transistor structure TS shown in FIG. 6.

Referring to FIG. 7, in the transistor structure TS shown in FIG. 6, the dielectric layer 5116 may include first to third sub dielectric layers 5117, 5118 and 5119.

The surface layer 5114 of p-type silicon in each of the pillars 5113 may serve as a body. The first sub dielectric layer 5117 adjacent to the pillar 5113 may serve as a tunneling dielectric layer, and may include a thermal oxidation layer.

The second sub dielectric layer 5118 may serve as a charge storing layer. The second sub dielectric layer 5118 may serve as a charge capturing layer, and may include a nitride layer or a metal oxide layer such as an aluminum oxide layer, a hafnium oxide layer, or the like.

The third sub dielectric layer 5119 adjacent to the conductive material 5233 may serve as a blocking dielectric layer. The third sub dielectric layer 5119 adjacent to the conductive material 5233 which extends in the first direction may be formed as a single layer or multiple layers. The third sub dielectric layer 5119 may be a high-k dielectric layer such as an aluminum oxide layer, a hafnium oxide layer, or the like, which has a dielectric constant greater than the first and second sub dielectric layers 5117 and 5118.

The conductive material 5233 may serve as a gate or a control gate. That is, the gate or the control gate 5233, the blocking dielectric layer 5119, the charge storing layer 5118, the tunneling dielectric layer 5117 and the body 5114 may form a transistor or a memory cell transistor structure. For example, the first to third sub dielectric layers 5117 to 5119 may form an oxide-nitride-oxide (ONO) structure. In the embodiment, for the sake of convenience, the surface layer 5114 of p-type silicon in each of the pillars 5113 will be referred to as a body in the second direction.

The memory block BLKi may include the plurality of pillars 5113. Namely, the memory block BLKi may include the plurality of NAND strings NS. In detail, the memory block BLKi may include the plurality of NAND strings NS which extend in the second direction or a direction perpendicular to the substrate 5111.

Each NAND string NS may include the plurality of transistor structures TS which are disposed in the second direction. At least one of the plurality of transistor structures TS of each NAND string NS may serve as a string source transistor SST. At least one of the plurality of transistor structures TS of each NAND string NS may serve as a ground select transistor GST.

The gates or control gates may correspond to the conductive materials 5211 to 5291, 5212 to 5292 and 5213 to 5293 which extend in the first direction. In other words, the gates or the control gates may extend in the first direction and form word lines and at least two select lines, at least one source select line SSL and at least one ground select line GSL.

The conductive materials 5331 to 5333 which extend in the third direction may be electrically coupled to one end of the NAND strings NS. The conductive materials 5331 to 5333 which extend in the third direction may serve as bit lines BL. That is, in one memory block BLKi, the plurality of NAND strings NS may be electrically coupled to one bit line BL.

The second type doping regions 5311 to 5314 which extend in the first direction may be provided to the other ends of the NAND strings NS. The second type doping regions 5311 to 5314 which extend in the first direction may serve as common source lines CSL.

Namely, the memory block BLKi may include a plurality of NAND strings NS which extend in a direction perpendicular to the substrate 5111, e.g., the second direction, and may serve as a NAND flash memory block, for example, of a charge capturing type memory, in which a plurality of NAND strings NS are electrically coupled to one bit line BL.

While it is illustrated in FIGS. 5 to 7 that the conductive materials 5211 to 5291, 5212 to 5292 and 5213 to 5293 which extend in the first direction are provided in 9 layers, it is to be noted that the conductive materials 5211 to 5291, 5212 to 5292 and 5213 to 5293 which extend in the first direction are not limited to being provided in 9 layers. For example, conductive materials which extend in the first direction may be provided in 8 layers, 16 layers or any multiple of layers. In other words, in one NAND string NS, the number of transistors may be 8, 16 or more.

While it is illustrated in FIGS. 5 to 7 that 3 NAND strings NS are electrically coupled to one bit line BL, it is to be noted that the embodiment is not limited to having 3 NAND strings NS that are electrically coupled to one bit line BL. In the memory block BLKi, m number of NAND strings NS may be electrically coupled to one bit line BL, m being a positive integer. According to the number of NAND strings NS which are electrically coupled to one bit line BL, the number of conductive materials 5211 to 5291, 5212 to 5292 and 5213 to 5293 which extend in the first direction and the number of common source lines 5311 to 5314 may be controlled as well.

Further, while it is illustrated in FIGS. 5 to 7 that 3 NAND strings NS are electrically coupled to one conductive material which extends in the first direction, it is to be noted that the embodiment is not limited to having 3 NAND strings NS electrically coupled to one conductive material which extends in the first direction. For example, n number of NAND strings NS may be electrically coupled to one conductive material which extends in the first direction, n being a positive integer. According to the number of NAND strings NS which are electrically coupled to one conductive material which extends in the first direction, the number of bit lines 5331 to 5333 may be controlled as well.

Figure 8:
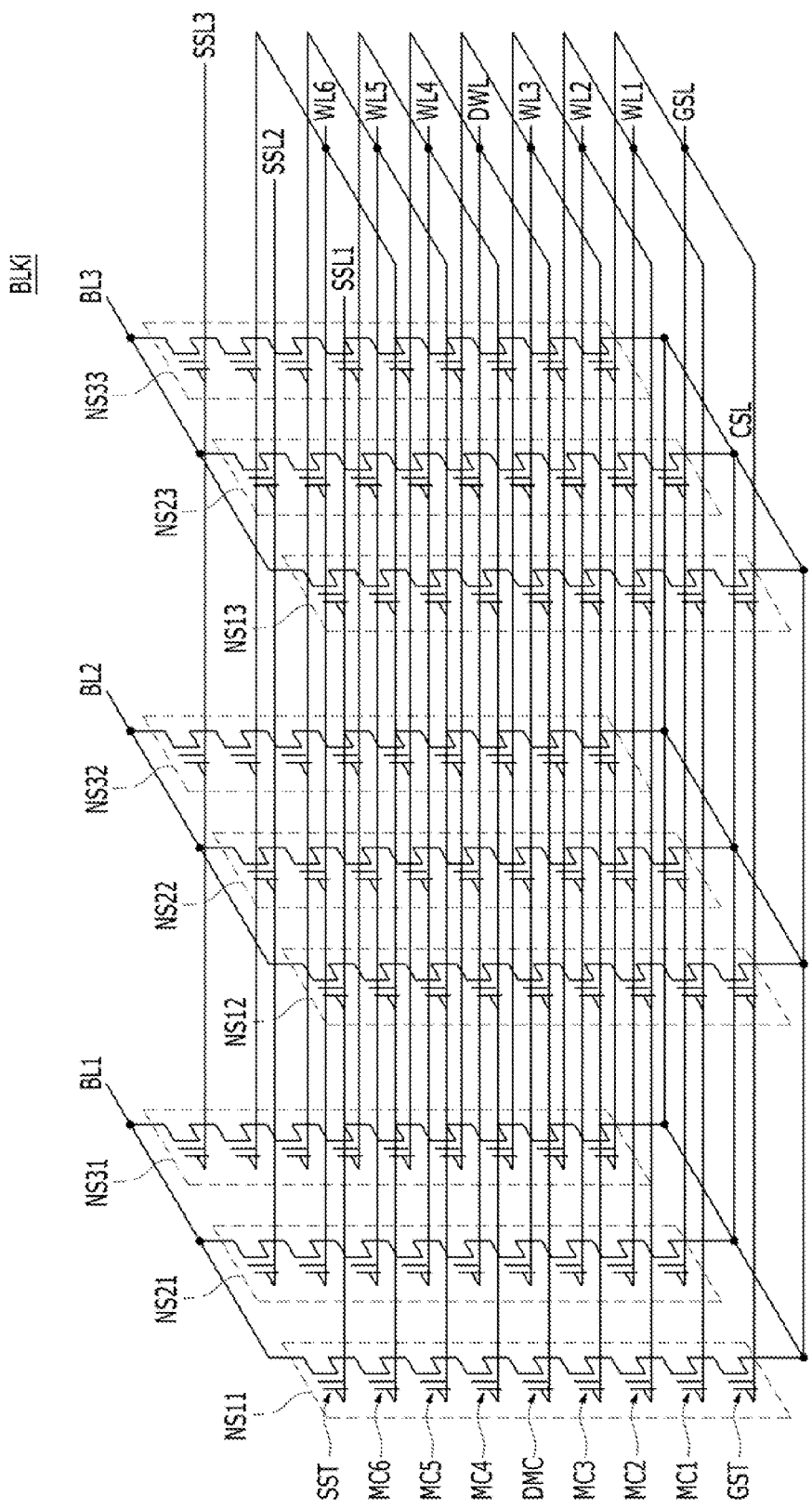

FIG. 8 is an equivalent circuit diagram illustrating the memory block BLKi having a first structure described with reference to FIGS. 5 to 7.

Referring to FIG. 8, in a block BLKi having the first structure, NAND strings NS11 to NS31 may be provided between a first bit line BL1 and a common source line CSL. The first bit line BL1 may correspond to the conductive material 5331 of FIGS. 5 and 6, which extends in the third direction. NAND strings NS12 to NS32 may be provided between a second bit line BL2 and the common source line CSL. The second bit line BL2 may correspond to the conductive material 5332 of FIGS. 5 and 6, which extends in the third direction. NAND strings NS13 to NS33 may be provided between a third bit line BL3 and the common source line CSL. The third bit line BL3 may correspond to the conductive material 5333 of FIGS. 5 and 6, which extends in the third direction.

A source select transistor SST of each NAND string NS may be electrically coupled to a corresponding bit line BL. A ground select transistor GST of each NAND string NS may be electrically coupled to the common source line CSL. Memory cells MC may be provided between the source select transistor SST and the ground select transistor GST of each NAND string NS.

In this example, NAND strings NS may be defined by the unit of row and column and NAND strings NS which are electrically coupled to one bit line may form one column. The NAND strings NS11 to NS31 which are electrically coupled to the first bit line BL1 may correspond to a first column, the NAND strings NS12 to NS32 which are electrically coupled to the second bit line BL2 may correspond to a second column, and the NAND strings NS13 to NS33 which are electrically coupled to the third bit line BL3 may correspond to a third column. NAND strings NS which are electrically coupled to one source select line SSL may form one row. The NAND strings NS11 to NS13 which are electrically coupled to a first source select line SSL1 may form a first row, the NAND strings NS21 to NS23 which are electrically coupled to a second source select line SSL2 may form a second row, and the NAND strings NS31 to NS33 which are electrically coupled to a third source select line SSL3 may form a third row.

In each NAND string NS, a height may be defined. In each NAND string NS, the height of a memory cell MC1 adjacent to the ground select transistor GST may be a value '1'. In each NAND string NS, the height of a memory cell may increase as the memory cell gets closer to the source select transistor SST when measured from the substrate 5111. In each NAND string NS, the height of a memory cell MC6 adjacent to the source select transistor SST may be 7.

The source select transistors SST of the NAND strings NS in the same row may share the source select line SSL. The source select transistors SST of the NAND strings NS in different rows may be respectively electrically coupled to the different source select lines SSL1, SSL2 and SSL3.

The memory cells at the same height in the NAND strings NS in the same row may share a word line WL. That is, at the same height, the word lines WL electrically coupled to the memory cells MC of the NAND strings NS in different rows may be electrically coupled. Dummy memory cells DMC at the same height in the NAND strings NS of the same row may share a dummy word line DWL. Namely, at the same height, the dummy word lines DWL electrically coupled to the dummy memory cells DMC of the NAND strings NS in different rows may be electrically coupled.

The word lines WL or the dummy word lines DWL located at the same level or height or layer may be electrically coupled with one another at layers where the conductive materials 5211 to 5291, 5212 to 5292 and 5213 to 5293 which extend in the first direction are provided. The conductive materials 5211 to 5291, 5212 to 5292 and 5213 to 5293 which extend in the first direction may be electrically coupled in common to upper layers through contacts. At the upper layers, the conductive materials 5211 to 5291, 5212 to 5292 and 5213 to 5293 which extend in the first direction may be electrically coupled. In other words, the ground select transistors GST of the NAND strings NS in the same row may share the ground select line GSL. Further, the ground select transistors GST of the NAND strings NS in different rows may share the ground select line GSL. That is, the NAND strings NS11 to NS13, NS21 to NS23 and NS31 to NS33 may be electrically coupled to the ground select line GSL.

The common source line CSL may be electrically coupled to the NAND strings NS. Over the active regions and over the substrate 5111, the first to fourth doping regions 5311 to 5314 may be electrically coupled. The first to fourth doping regions 5311 to 5314 may be electrically coupled to an upper layer through contacts and, at the upper layer, the first to fourth doping regions 5311 to 5314 may be electrically coupled.

Namely, as shown in FIG. 8, the word lines WL of the same height or level may be electrically coupled. Accordingly, when a word line WL at a specific height is selected, all NAND strings NS which are electrically coupled to the word line WL may be selected. The NAND strings NS in different rows may be electrically coupled to different source select lines SSL. Accordingly, among the NAND strings NS electrically coupled to the same word line WL, by selecting one of the source select lines SSL1 to SSL3, the NAND strings NS in the unselected rows may be electrically isolated from the bit lines BL1 to BL3. In other words, by selecting one of the source select lines SSL1 to SSL3, a row of NAND strings NS may be selected. Moreover, by selecting one of the bit lines BL1 to BL3, the NAND strings NS in the selected rows may be selected in units of columns.

In each NAND string NS, a dummy memory cell DMC may be provided. In FIG. 8, the dummy memory cell DMC may be provided between a third memory cell MC3 and a fourth memory cell MC4 in each NAND string NS. That is, first to third memory cells MC1 to MC3 may be provided between the dummy memory cell DMC and the ground select transistor GST. Fourth to sixth memory cells MC4 to MC6 may be provided between the dummy memory cell DMC and the source select transistor SST. The memory cells MC of each NAND string NS may be divided into memory cell groups by the dummy memory cell DMC. In the divided memory cell groups, memory cells, for example, MC1 to MC3 adjacent to the ground select transistor GST may be referred to as a lower memory cell group, and memory cells, for example, MC4 to MC6, adjacent to the string select transistor SST may be referred to as an upper memory cell group.

Hereinbelow, detailed descriptions will be made with reference to FIGS. 9 to 11, which shows the memory device in the memory system in accordance with an embodiment implemented with a three-dimensional (3D) nonvolatile memory device different from the first structure.

Figure 9:
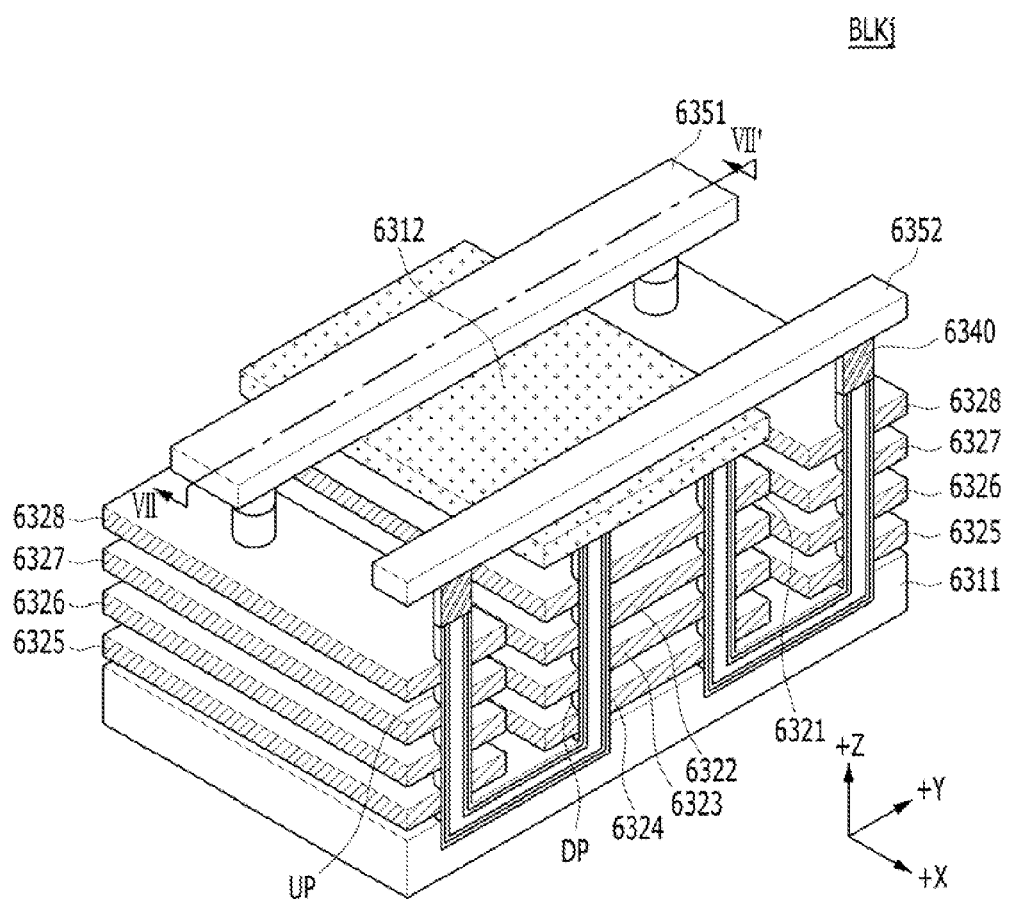

FIG. 9 is a perspective view schematically illustrating the memory device implemented with the three-dimensional (3D) nonvolatile memory device, which is different from the first structure described above with reference to FIGS. 5 to 8, and showing a memory block BLKj in the plurality of memory blocks of FIG. 4. FIG. 10 is a cross-sectional view illustrating a memory block BLKj taken along the line VII-VII' of FIG. 9.

Figure 10:
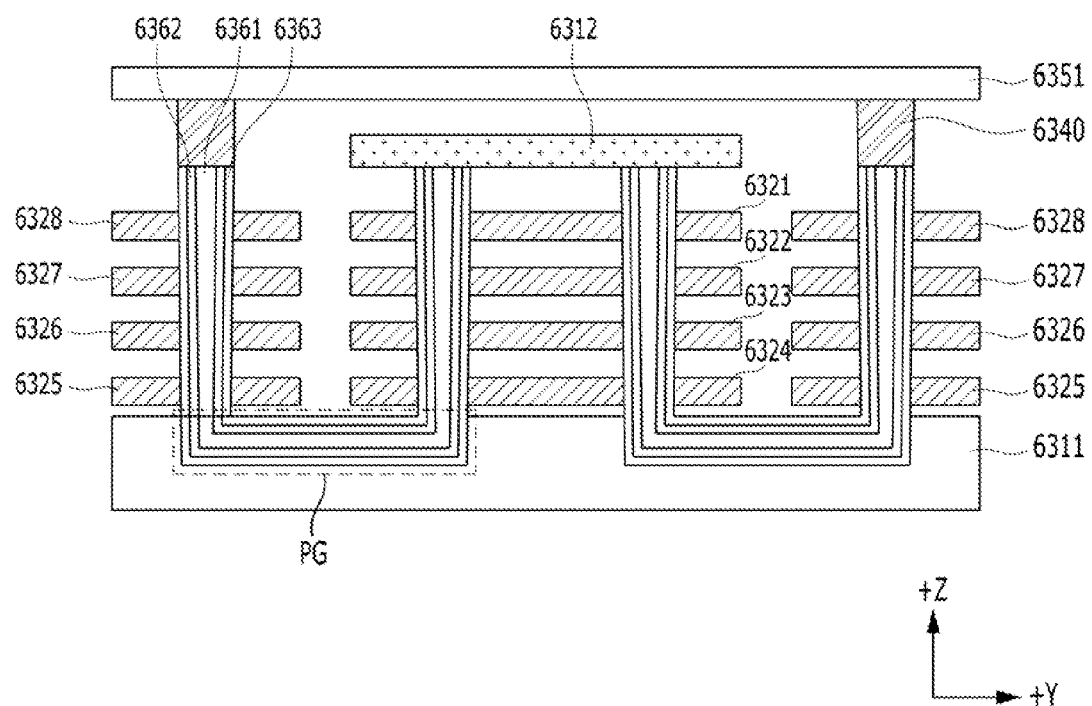

Referring to FIGS. 9 and 10, the memory block BLKj among the plurality of memory blocks of the memory device 150 of FIG. 1 may include structures which extend in the first to third directions.

A substrate 6311 may be provided. For example, the substrate 6311 may include a silicon material doped with a first type impurity. For example, the substrate 6311 may include a silicon material doped with a p-type impurity or may be a p-type well, for example a pocket p-well and include an n-type well which surrounds the p-type well. While it is assumed in the embodiment for the sake of convenience that the substrate 6311 is p-type silicon, it is to be noted that the substrate 6311 is not limited to being p-type silicon.

First to fourth conductive materials 6321 to 6324 which extend in the x-axis direction and the y-axis direction are provided over the substrate 6311. The first to fourth conductive materials 6321 to 6324 may be separated by a predetermined distance in the z-axis direction.

Fifth to eighth conductive materials 6325 to 6328 which extend in the x-axis direction and the y-axis direction may be provided over the substrate 6311. The fifth to eighth conductive materials 6325 to 6328 may be separated by the predetermined distance in the z-axis direction. The fifth to eighth conductive materials 6325 to 6328 may be separated from the first to fourth conductive materials 6321 to 6324 in the y-axis direction.

A plurality of lower pillars DP which pass through the first to fourth conductive materials 6321 to 6324 may be provided. Each lower pillar DP extends in the z-axis direction. Also, a plurality of upper pillars UP which pass through the fifth to eighth conductive materials 6325 to 6328 may be provided. Each upper pillar UP extends in the z-axis direction.

Each of the lower pillars DP and the upper pillars UP may include an internal material 6361, an intermediate layer 6362, and a surface layer 6363. The intermediate layer 6362 may serve as a channel of the cell transistor. The surface layer 6363 may include a blocking dielectric layer, a charge storing layer and a tunneling dielectric layer.

The lower pillar DP and the upper pillar UP may be electrically coupled through a pipe gate PG. The pipe gate PG may be disposed in the substrate 6311. For instance, the pipe gate PG may include the same material as the lower pillar DP and the upper pillar UP.

A doping material 6312 of a second type which extends in the x-axis direction and the y-axis direction may be provided over the lower pillars DP. For example, the doping material 6312 of the second type may include an n-type silicon material. The doping material 6312 of the second type may serve as a common source line CSL.

Drains 6340 may be provided over the upper pillars UP. The drains 6340 may include an n-type silicon material. First and second upper conductive materials 6351 and 6352 which extend in the y-axis direction may be provided over the drains 6340.

The first and second upper conductive materials 6351 and 6352 may be separated in the x-axis direction. The first and second upper conductive materials 6351 and 6352 may be formed of a metal. The first and second upper conductive materials 6351 and 6352 and the drains 6340 may be electrically coupled through contact plugs. The first and second upper conductive materials 6351 and 6352 respectively serve as first and second bit lines BL1 and BL2.

The first conductive material 6321 may serve as a source select line SSL, the second conductive material 6322 may serve as a first dummy word line DWL1 and the third and fourth conductive materials 6323 and 6324 serve as first and second main word lines MWL1 and MWL2, respectively. The fifth and sixth conductive materials 6325 and 6326 serve as third and fourth main word lines MWL3 and MWL4, respectively, the seventh conductive material 6327 may serve as a second dummy word line DWL2, and the eighth conductive material 6328 may serve as a drain select line DSL.

The lower pillar DP and the first to fourth conductive materials 6321 to 6324 adjacent to the lower pillar DP form a lower string. The upper pillar UP and the fifth to eighth conductive materials 6325 to 6328 adjacent to the upper pillar UP form an upper string. The lower string and the upper string may be electrically coupled through the pipe gate PG. One end of the lower string may be electrically coupled to the doping material 6312 of the second type which serves as the common source line CSL. One end of the upper string may be electrically coupled to a corresponding bit line through the drain 6340. One lower string and one upper string form one cell string which is electrically coupled between the doping material 6312 of the second type serving as the common source line CSL and a corresponding one of the upper conductive material layers 6351 and 6352 serving as the bit line BL.

That is, the lower string may include a source select transistor SST, the first dummy memory cell DMC1, and the first and second main memory cells MMC1 and MMC2. The upper string may include the third and fourth main memory cells MMC3 and MMC4, the second dummy memory cell DMC2, and a drain select transistor DST.

In FIGS. 9 and 10, the upper string and the lower string may form a NAND string NS, and the NAND string NS may include a plurality of transistor structures TS. Since the transistor structure included in the NAND string NS in FIGS. 9 and 10 is described above in detail with reference to FIG. 7, a detailed description thereof will be omitted herein.

Figure 11:
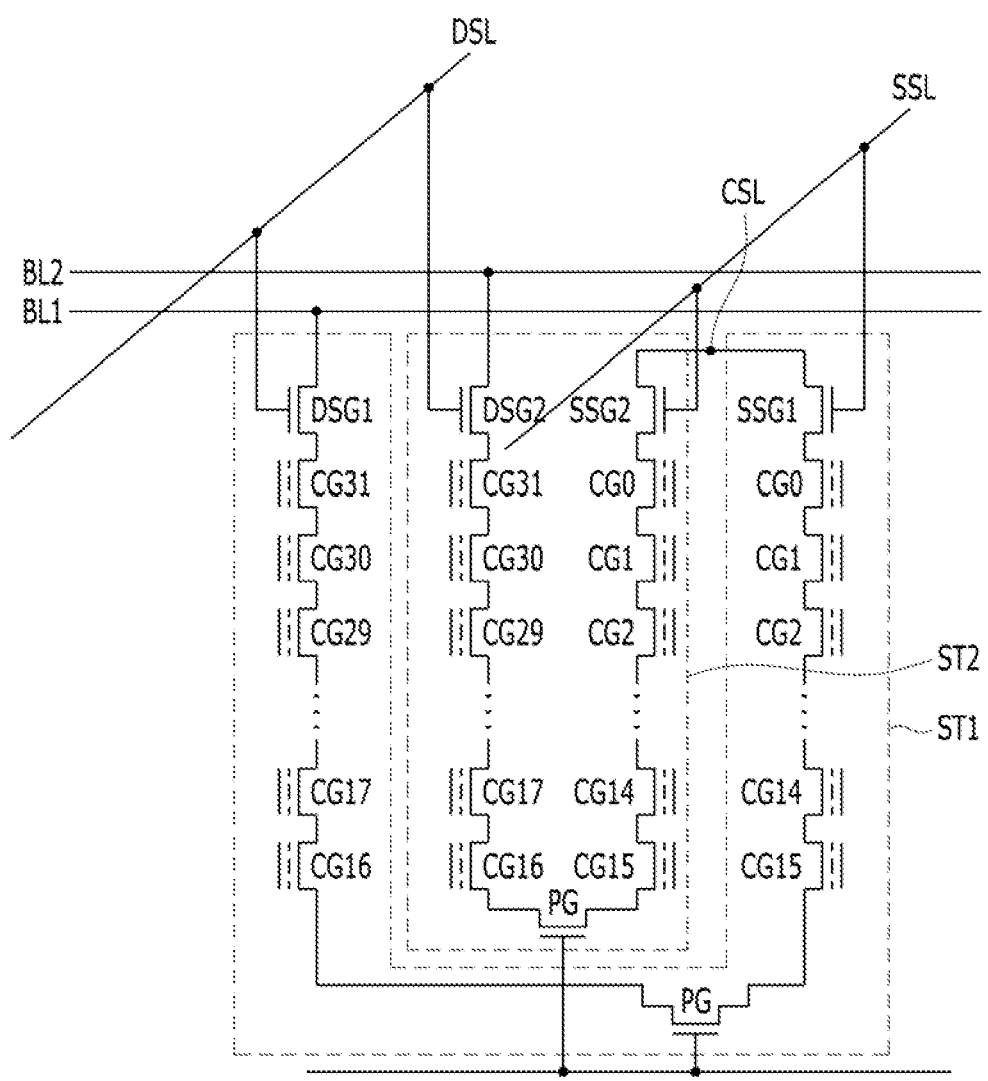

FIG. 11 is a circuit diagram illustrating the equivalent circuit of the memory block BLKj having the second structure as described above with reference to FIGS. 9 and 10. For the sake of convenience, only a first string and a second string, which form a pair in a memory block BLKj in the second structure, are shown.

Referring to FIG. 11, in a memory block BLKj having the second structure among the plurality of blocks of the memory device 150, cell strings, each of which is implemented with one upper string and one lower string electrically coupled through the pipe gate PG as described above with reference to FIGS. 9 and 10, may be provided in such a way as to define a plurality of pairs.

Namely, in a memory block BLKj having the second structure, memory cells CG0 to CG31 stacked along a first channel CH1 (not shown), for example, at least one source select gate SSG1 and at least one drain select gate DSG1 may form a first string ST1, and memory cells CG0 to CG31 stacked along a second channel CH2 (not shown), for example, at least one source select gate SSG2 and at least one drain select gate DSG2 may form a second string ST2.

The first string ST1 and the second string ST2 may be electrically coupled to the same drain select line DSL and the same source select line SSL. The first string ST1 may be electrically coupled to a first bit line BL1 and the second string ST2 may be electrically coupled to a second bit line BL2.

While it is described in FIG. 11 that the first string ST1 and the second string ST2 are electrically coupled to the same drain select line DSL and the same source select line SSL, it may be envisaged that the first string ST1 and the second string ST2 may be electrically coupled to the same source select line SSL and the same bit line BL, the first string ST1 may be electrically coupled to a first drain select line DSL1 and the second string ST2 may be electrically coupled to a second drain select line DSL2. Further it may be envisaged that the first string ST1 and the second string ST2 may be electrically coupled to the same drain select line DSL and the same bit line BL, the first string ST1 may be electrically coupled to a first source select line SSL1 and the second string ST2 may be electrically coupled a second source select line SSL2. Hereinbelow, an operation of processing data to a memory device in a memory system in accordance with an embodiment of the present invention, particularly, a data program operation or data write operation will be described in detail with reference to FIGS. 12 to 15.

Figure 12:
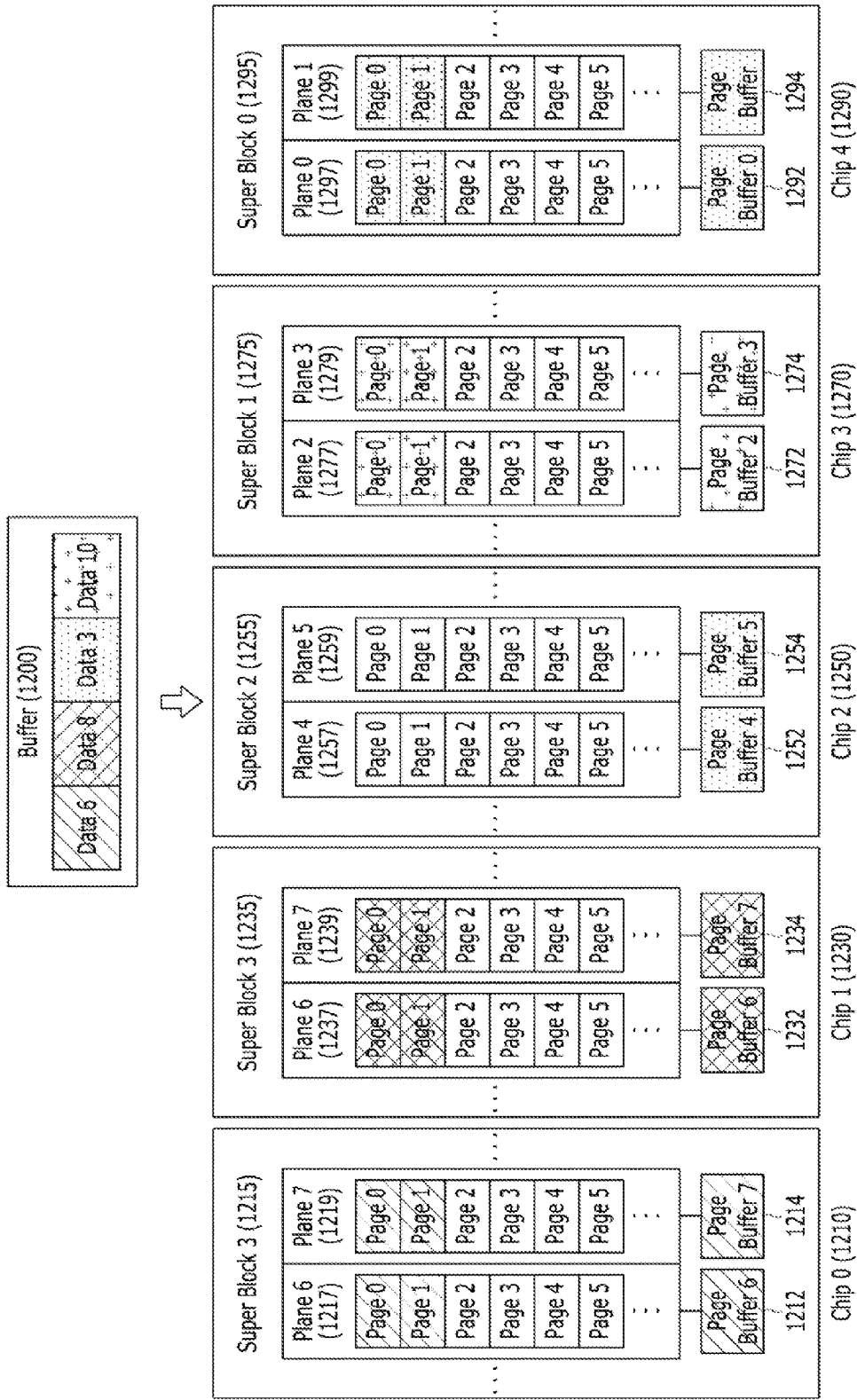
FIGS. 12 to 14 are schematic diagrams illustrating an operation of the memory system shown in FIG. 1.
Figure 13:
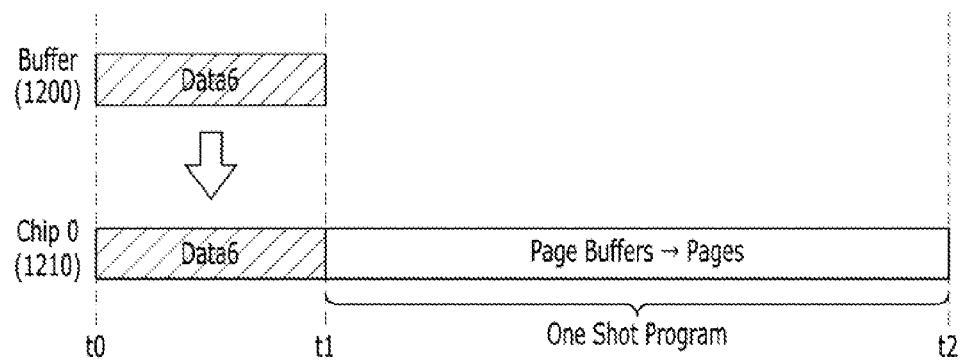
Figure 14:
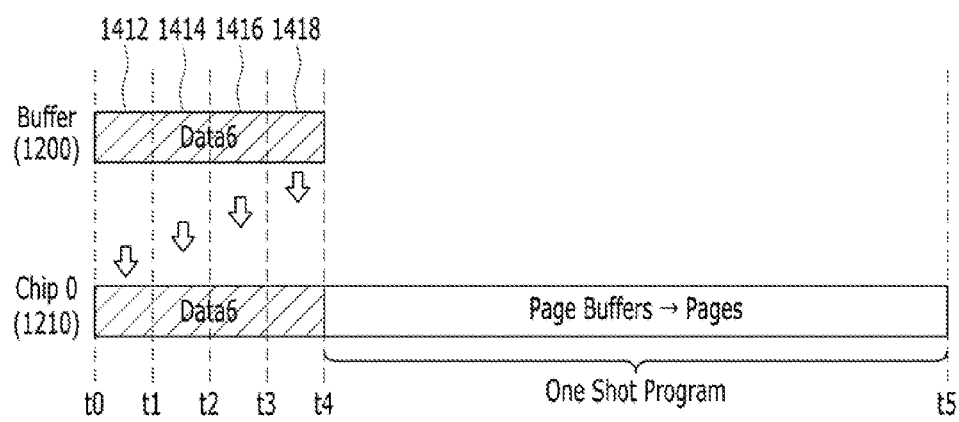

FIGS. 12 to 14 are schematic diagrams illustrating an operation of the memory system 110 shown in FIG. 1.

As described above, the memory 144 of the controller 130 may include a program memory, a data memory, a write buffer, a read buffer, a map buffer, and so forth. The buffer may be a temporary storage including a cache. Hereinbelow, it is described as an example that the write data corresponding to the write command provided from the host 102 is stored in the write buffer of the memory 144, and then the write data stored in the write buffer, or the buffered data, is programmed into the memory device 150.

Further, while it is described below as an example that the controller 130 performs the data processing in the memory system, it is to be noted that, the processor 134 may also perform the data processing. Also, while it is described below as an example that the write data are stored in the write buffer, it is to be noted that the write data may also be stored in the plurality of page buffers 322, 324 and 326, a plurality of latches included in the memory device 300, or an external memory device.

In accordance with an exemplary embodiment of the present invention, the buffered write data may be programmed into one or more super blocks, which is groups of the plurality of memory blocks of the memory device 150, through one or more of a one shot program, a multi-plane program and a one plane program. The buffered write data of the write buffer may be transferred to and stored in a page buffer of the memory chips included in the memory device 150 while the write buffer and the memory chips are joining each other for data transfer. After the transfer of the write data from the write buffer of the controller 130 to the page buffer of the memory chips, the write buffer and the memory chips may be released from each other. The write data stored in the page buffer of the memory chips may be programmed in the super blocks of the me memory chips in the memory device 150.

In accordance with an exemplary embodiment of the present invention, data having 64 KB chunk size may be programmed in the pages of the super blocks through the one shot program, data having 32 KB chunk size may be programmed in the pages through the multi-plane program, and data having 16 KB chunk size may be programmed in the pages through the one plane program.

Referring to FIG. 12, the controller 130 may store the write data corresponding to the write command provided from the host 102 in the write buffer 1200 included in the memory 144 of the controller 130, and then may program the buffered write data in the plurality of memory chips of the memory device 150. Each of the plurality of memory chips may include the plurality of memory blocks.

FIGS. 12 to 15 exemplarily show data 6, data 8, data 3 and data 10 as the write data buffered in the write buffer 1200. Hereinbelow, it will be described as an example that each of the chunk sizes of the write data (1202 to 1208) is 64 KB.

FIGS. 12 to 15 exemplarily show chips 0 to 4 (1210 to 1290) as the plurality of memory chips included in the memory device 150. FIGS. 12 to 15 exemplarily show page buffers 6 and 7 (1212 and 1214), page buffers 6 and 7 (1232 and 1234), page buffers 4 and 5 (1252 and 1254), page buffers 2 and 3 (1272 and 1274), and page buffers 0 and 1 (1292 and 1294) as the page buffers included in the chips 0 to 4 (1210 to 1290), respectively.

FIGS. 12 to 15 exemplarily show a super block 3 (1215), a super block 3 (1235), a super block 2 (1255), a super block 1 (1275), and a super block 0 (1295) as the super blocks included in the chips 0 to 4 (1210 to 1290) respectively. FIGS. 12 to 15 exemplarily show the super blocks, each of which includes two memory blocks or planes, the number of which may vary according to the capacity and the data program performance of the memory device 150. Each of the super blocks (1215 to 1295) may include different numbers of memory blocks or planes.

FIGS. 12 to 15 exemplarily show planes 6 and 7 (1217 and 1219), planes 6 and 7 (1237 and 1239), planes 4 and 5 (1257 and 1259), planes 2 and 3 (1277 and 1279), and planes 0 and 1 (1297 and 1299) as the planes included in the super blocks 0 to 3 (1215 to 1295), respectively. As shown in FIG. 12, each of the planes may include the plurality of pages. Hereafter, it will be described as an example that storage capacity of each of the plurality of pages is 16 KB. As shown in FIG. 12, each of the memory blocks or planes may be coupled to a corresponding one of the page buffers (1212 to 1294).

For example, the chip 0 (1210) may include the plurality of super blocks, and the super block 3 (1215) of the plurality of super blocks may include may include at least the memory blocks 6 and 7 (1217 and 1219), each of which includes a plurality of pages. The storage capacity of each of the memory blocks 6 and 7 (1217 and 1219) may be 16 KB. The plane 6 (1217) may be a least significant bit (LSB) plane and the plane 7 (1219) may be a most significant bit (MSB) plane.

For example, the chip 1 (1230) may include the plurality of super blocks, and the super block 3 (1235) of the plurality of super blocks may include may include at least the memory blocks 6 and 7 (1237 and 1239), each of which includes a plurality of pages. The storage capacity of each of the memory blocks 6 and 7 (1237 and 1239) may be 16 KB. The plane 6 (1237) may be an LSB plane and the plane 7 (1219) may be an MSB plane.

For example, the chip 2 (1250) may include the plurality of super blocks, and the super block 2 (1255) of the plurality of super blocks may include may include at least the memory blocks 4 and 5 (1257 and 1259), each of which includes a plurality of pages. The storage capacity of each of the memory blocks 4 and 5 (1257 and 1259) may be 16 KB. The plane 4 (1257) may be an LSB plane and the plane 5 (1259) may be an MSB plane.

For example, the chip 3 (1270) may include the plurality of super blocks, and the super block 1 (1275) of the plurality of super blocks may include may include at least the memory blocks 2 and 3 (1277 and 1279) each of which includes a plurality of pages. The storage capacity of each of the memory blocks 2 and 3 (1277 and 1279) may be 16 KB. The plane 2 (1277) may be an LSB plane and the plane 3 (1279) may be an MSB plane.

For example, the chip 4 (1290) may include the plurality of super blocks, and the super block 0 (1295) of the plurality of super blocks may include may include at least the memory blocks 0 and 1 (1297 and 1299), each of which includes a plurality of pages. The storage capacity of each of the memory blocks 0 and 1 (1297 and 1299) may be 16 KB. The plane 0 (1297) may be an LSB plane and the plane 1 (1299) may be an MSB plane.

The controller 130 may check the chunk sizes of the write data (1202 to 1208) stored in the write buffer 1200. The plurality of pages included in the planes 6 and 7 (1217 and 1219) of the super block 3 (1215), which is included in the chip 0 (1210), may be programmed with the write data having 64 KB chunk size through the one shot program.

For example, the write data 6 may be transferred from the write buffer 1200 to the page buffers 6 and 7 (1212 and 1214) of the chip 0 (1210), respectively. After the transfer of the write data 6 from the write buffer 1200 to the page buffers 6 and 7 (1212 and 1214), the write buffer 1200 and the chip 0 (1210) may be released from each other. And then, the write data 6 stored in the page buffers 6 and 7 (1212 and 1214) may be programmed in the pages 0 and 1 of each of the planes 6 and 7 (1217 and 1219), which respectively correspond to the page buffers 6 and 7 (1212 and 1214) within the chip 0 (1210), through the one shot program. The release of the write buffer 1200 and the chip 0 (1210) from each other will be described later in detail with reference to FIGS. 13 and 14.

Further, the chip 1 1230 includes a plurality of super blocks into each of which a plurality of memory blocks, that is, a plurality of planes, each including a plurality of pages are grouped, and a super block 3 1235 of the chip 1 1230 includes two memory blocks, that is, a plane 6 1237 as a memory block 6 including a plurality of pages and a plane 7 1239 as a memory block 7 including a plurality of pages. The size of the plurality of pages included in each of the planes 1237 and 1239 in the super block 3 1235 of the chip 1 1230, that is, a chunk size as the size of data capable of being programmed in each of the pages, is 16 KB. Also, detailed descriptions will be made below by taking an example that the plane 6 1237 of the super block 3 1235 is an LSB plane and the plane 7 1239 of the super block 3 1235 is an MSB plane. The plurality of pages included in the planes 6 and 7 (1237 and 1239) of the super block 3 (1235), which is included in the chip 1 (1230), may be programmed with the write data having 64 KB chunk size through the one shot program.

For example, the write data 8 may be transferred from the write buffer 1200 to the page buffers 6 and 7 (1232 and 1234) of the chip 1 (1230), respectively. After the transfer of the write data 8 from the write buffer 1200 to the page buffers 6 and 7 (1232 and 1234), the write buffer 1200 and the chip 1 (1230) may be released from each other. And then, the write data 8 stored in the page buffers 6 and 7 (1232 and 1234) may be programmed in the pages 0 and 1 of each of the planes 6 and 7 (1237 and 1239), which respectively correspond to the page buffers 6 and 7 (1232 and 1234) within the chip 1 (1230), through the one shot program. The release of the write buffer 1200 and the chip 1 (1230) from each other will be described later in detail with reference to FIGS. 13 and 14.

The plurality of pages included in the planes 4 and 5 (1257 and 1259) of the super block 2 (1255), which is included in the chip 2 (1250), may be programmed with the write data having 64 KB chunk size through the one shot program.

For example, the write data 3 may be transferred from the write buffer 1200 to the page buffers 4 and 5 (1252 and 1254) of the chip 2 (1250), respectively. After the transfer of the write data 3 from the write buffer 1200 to the page buffers 4 and 5 (1252 and 1254), the write buffer 1200 and the chip 2 (1250) may be released from each other. And then, the write data 3 stored in the page buffers 4 and 5 (1252 and 1254) may be programmed in the pages 0 and 1 of each of the planes 4 and 5 (1257 and 1259), which respectively correspond to the page buffers 4 and 5 (1252 and 1254) within the chip 2 (1250), through the one shot program.

However, when the programming of the write data 3 stored in the page buffers 4 and 5 (1252 and 1254) into the pages 0 and 1 of the planes 4 and 5 (1257 and 1259) fails in the chip 2 (1250) after the release between the write buffer 1200 and the chip 2 (1250), the write buffer 1200 and the chip 2 (1250) may rejoin each other. And then, the write data 3 may be transferred back from the page buffers 4 and 5 (1252 and 1254) to the write buffer 1200.

After rejoining of the write buffer 1200 and the chip 2 (1250) and the transfer of the write data 3 back from the page buffers 4 and 5 (1252 and 1254) to the write buffer 1200, the program-failed write data 3 of the write buffer 1200 may be programmed in one of the chips 0 to 4 (1210 to 1290) other than the program-failed chip 2 (1250). For example, the program-failed write data 3 (1260) may be programmed in the chip 4 (1290), depending on design.

The plurality of pages included in the planes 0 and 1 (1297 and 1299) of the super block 0 (1295), which is included in the chip 4 (1290), may be programmed with the write data having 64 KB chunk size through a one shot program.

For example, the program-failed write data 3, which is previously transferred back from the page buffers 4 and 5 (1252 and 1254) to the write buffer 1200, may be transferred from the write buffer 1200 to the page buffers 0 and 1 (1292 and 1294) of the chip 4 (1290), respectively. After the transfer of the write data 3 from the write buffer 1200 to the page buffers 0 and 1 (1292 and 1294), the write buffer 1200 and the chip 4 (1290) may be released from each other. And then, the write data 3 stored in the page buffers 0 and 1 (1292 and 1294) may be programmed in the pages 0 and 1 of each of the planes 0 and 1 (1297 and 1299), which respectively correspond to the page buffers 0 and 1 (1292 and 1294) within the chip 4 (1290), through the one shot program. The release of the write buffer 1200 and the chip 4 (1290) will be described later in detail with reference to FIGS. 13 and 14.

The plurality of pages included in the planes 6 and 7 (1217 and 1219) of the super block 3 (1215) which is included in the chip 0 (1210), may be programmed with the write data having 64 KB chunk size through one shot program.

For example, the write data 10 may be transferred from the write buffer 1200 to the page buffers 2 and 3 (1272 and 1274) of the chip 3 (1270), respectively. After the transfer of the write data 10 from the write buffer 1200 to the page buffers 2 and 3 (1272 and 1274), the write buffer 1200 and the chip 3 (1270) may be released from each other. And then, the write data 10 stored in the page buffers 2 and 3 (1272 and 1274) may be programmed in the pages 0 and 1 of each of the planes 2 and 3 (1277 and 1279), which respectively correspond to the page buffers 2 and 3 (1272 and 1274) within the chip 3 (1270), through the one shot program. The release of the write buffer 1200 and the chip 3 (1270) from each other will be described later in detail with reference to FIGS. 13 and 14.

Hereinbelow, exemplarily disclosed n detail with reference to FIGS. 13 and 14 is the transfer of the write data from the write buffer 1200 to page buffers included in a corresponding one of the chips and the release between the write buffer 1200 and the corresponding chip, which is described above with reference to FIG. 12.

As described above, the controller 130 may store the write data, for example, data 6 corresponding to the write command provided from the host 102, in the buffer 1200. The controller 130 may check the chunk size of the write data 6, for example, 64 KB, stored in the buffer 1200.

Referring to FIG. 13, when the write data 6 stored in the write buffer 1200 are programmed in the chip 0 (1210), the write data 6 may be transferred from the write buffer 1200 to page buffers of the chip 0 (1210) during a time interval between first and second time points t0 and t1, and then the write buffer 1200 and the chip 0 (1210) may be released from each other at the second time point t1. After the release between the chip 0 (1210) and the write buffer 1200, the write data 6 stored in the page buffers may be programmed in the LSB and MSB planes through the one shot program during a time interval between the second and third time points t1 and t2. After the programming of the write data 6 into the LSB and MSB planes, the controller 130 may check the success of the programming of the write data 6 at the third time point t2.

Referring to FIG. 14, when the write data 6 stored in the write buffer 1200 are to be programmed in the chip 0 (1210), the write data 6 may be programmed in the pages of the chip 0 (121) according to the storage capacity, for example, 16 KB, of each page of the chip 0 (1210). For example, when the chunk size of the write data 6 is 64 KB and the storage capacity of each page is 16 KB, the write data 6 may be programmed in several pages in units of 16 KB. The write data 6 stored in the write buffer 1200 may be divided into first to fourth data chunks 1412 to 1418, each chunk size of which is 16 KB. The first to fourth data of the write data 6 may be stored in first to fourth region in the write buffer 1200, respectively.

Referring to FIG. 14, when the write data 6 stored in the write buffer 1200 are programmed in the chip 0 (1210), the first data chunk 1412 of the write data 6 may be transferred from the first region of the write buffer 1200 to one of the page buffers, for example, the page buffer 6 (1212) included in the chip 0 (1210) during a time interval between first and second time points t0 and t1. The page buffer 6 (1212) may correspond to one of the plural planes, for example, the LSB plane 6 (1217). After the transfer of the first data chunk 1412 from the first region of the write buffer 1200 to the page buffer 6 (1212), the first region of the write buffer 1200 and the LSB plane 6 (1217), which corresponds to the page buffer 6 (1212), may be released from each other at the second time point t1.

After the release between the first region of the write buffer 1200 and the LSB plane 6 (1217), the second data chunk 1414 of the write data 6 may be transferred from the second region of the write buffer 1200 to one of the page buffers, for example, the page buffer 6 (1212) included in the chip 0 (1210) during a time interval between the second and third time points t1 and t2. After the transfer of the second data chunk 1414 from the second region of the write buffer 1200 to the page buffer 6 (1212), the second region of the write buffer 1200 and the LSB plane 6 (1217), which corresponds to the page buffer 6 (1212), may be released from each other at the third time point t2.

After the release between the second region of the write buffer 1200 and the LSB plane 6 (1217), the third data chunk 1416 of the write data 6 may be transferred from the third region of the write buffer 1200 to one of the page buffers, for example, the page buffer 7 (1214) included in the chip 0 (1210) during a time interval between the third and fourth time points t2 and t3. The page buffer 7 (1214) may correspond to one of the plural planes, for example, the MSB plane 7 (1219). After the transfer of the third data chunk 1416 from the third region of the write buffer 1200 to the page buffer 7 (1214), the third region of the write buffer 1200 and the MSB plane 7 (1219), which corresponds to the page buffer 7 (1214), may be released from each other at the fourth time point t3.

After the release between the third region of the write buffer 1200 and the MSB plane 7 (1219), the fourth data chunk 1418 of the write data 6 may be transferred from the fourth region of the write buffer 1200 to one of the page buffers, for example, the page buffer 7 (1214) included in the chip 0 (1210) during a time interval between the fourth and fifth time points t3 and t4. After the transfer of the fourth data chunk 1418 from the fourth region of the write buffer 1200 to the page buffer 7 (1214), the fourth region of the write buffer 1200 and the MSB plane 7 (1219), which corresponds to the page buffer 7 (1214), may be released from each other at the fifth time point t4.

As described above, after the sequential transfer of each data chunk 1412 to 1418 of the write data 6 from the corresponding region of the write buffer 1200 to the corresponding page buffer, each region of the write buffer 1200 and the corresponding plane may be sequentially released from each other.

After the release between the chip 0 (1210) and the write buffer 1200, the write data 6 stored in the page buffers may be programmed in the LSB and MSB planes through the one shot program during a time interval between the fifth and sixth time points t4 and t5. After the programming of the write data 6 into the LSB and MSB planes, the controller 130 may check the success of the programming of the write data 6 at the sixth time point t5.

In accordance with the exemplary embodiment of the present invention, the release may be made between the write buffer of the controller 130 and the corresponding plane of the memory device 150, after the data transfer from the controller 130 to the memory device 150, and before the programming of the transferred data into the memory device 150. Accordingly, the utilization efficiency of the buffer of the controller 130 may be improved.

Figure 15:
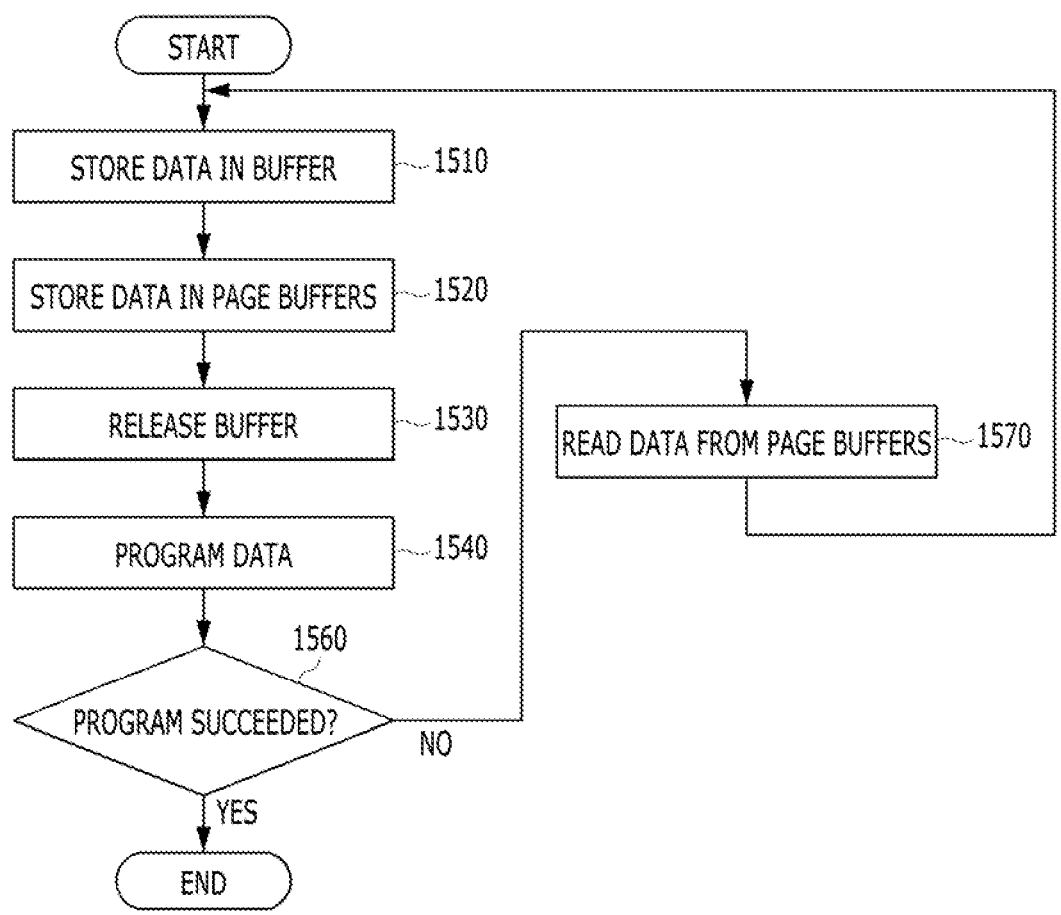
FIG. 15 is a flow chart illustrating an operation of the memory system shown in FIG. 1.

FIG. 15 is a flow chart illustrating the operation of the memory system 110 shown in FIG. 1.

Referring to FIG. 15, at step 1510, the memory system 110 may store the write data in the write buffer of the controller 130.

At step 1520, the controller 130 may transfer the buffered write data from the write buffer to one of page buffers included in the corresponding one among memory chips of the memory device 150.

At step 1530, the controller 130 may release the write buffer and one of the memory blocks or the planes, which corresponds to the page buffer temporarily storing the transferred write data, of the corresponding memory chip from each other. That is to say, the write buffer of the controller 130 may be released from the memory device 150.

At step 1540, the controller 130 may program the write data stored in the page buffer into the corresponding memory block or plane.

At step 1560, the controller 130 may check the success of the programming of the write data. When the controller 130 determines the programming is a success, the operation may end. When the controller 130 determines the programming is a failure, the controller 130 may rejoin the write buffer and the planes, may read the program-failed write data from the page buffer, and may repeat the steps 1510 to 1560 with one of the chips other than the program-failed chip. The repetition may end when the controller 130 determines the programming as success.

As is apparent from the above descriptions, the memory system and the operating method thereof according to the embodiments may maximize the efficiency of memory device usage and may quickly and stably process data from the memory device.

Although various embodiments have been described for illustrative purposes, it will be apparent to those skilled in the art that various changes and modifications may be made without departing from the spirit and scope of the invention as defined in the following claims.

What is claimed:

1. A memory system comprising:
a memory device including a plurality of memory chips, each of which includes a plurality of planes suitable for storing data and a plurality of page buffers respectively corresponding to the plural planes; and
a controller suitable for transferring write data stored in a write buffer thereof to a first page buffer of a first chip, deleting the write data stored in the write buffer for release of the write buffer and a first plane corresponding to the first page buffer in the first chip after the transfer to the first page buffer, and programming the write data in the first plane after the release from the first plane.

2. The memory system according to claim 1, wherein when the programming in the first chip fails, the controller further rejoins the write buffer and the first plane, and transfers the write data to second page buffer of a second chip.

3. The memory system according to claim 2, wherein the controller further deletes the write data stored in the write buffer for release of the write buffer and a second plane corresponding the second page buffer in the second chip after the transfer to the second page buffer, and programs the write data in the second plane after the release from the second plane.

4. The memory system according to claim 1, wherein the first plane includes a least significant bit (LSB) plane and a most significant bit (MSB) plane.

5. The memory system according to claim 1, wherein the controller programs the write data through one or more of a one shot program, a multi-plane program and a one plane program.

6. A memory system comprising:
a memory device including a plurality of memory chips, each of which includes a plurality of planes suitable for storing data and a plurality of page buffers respectively corresponding to the planes; and
a controller suitable for sequentially transferring a plurality of data chunks, which are included in write data and respectively stored in corresponding regions of a write buffer thereof, to a first page buffer of a first chip, deleting the data chunks respectively stored in the corresponding regions of the write buffer for release of the corresponding regions of the write buffer and a first plane corresponding to the first page buffer in the first chip after each transfer of the data chunks to the first page buffer, and programming the write data in the first plane after the release from the first plane.

7. The memory system according to claim 6, wherein when the programming a first data chunk in the first chip fails, the controller rejoins the first plane and a first region of the write buffer corresponding to the first data chunk, and transfers the first data chunk to a second page buffer of a second chip.

8. The memory system according to claim 7, wherein the controller further deletes the first data chunk stored in the first region for release of the first region and a second plane corresponding the second page buffer in the second chip after the transfer of the first data chunk to the second page buffer, and programs the first data chunk in the second plane after the release of the first region from the second plane.

9. The memory system according to claim 6, wherein the first plane includes a least significant bit (LSB) plane and a most significant bit (MSB) plane.

10. The memory system according to claim 6, wherein the controller programs the write data through one or more of a one shot program, a multi-plane program and a one plane program.

11. A method for operating a memory system including a plurality of memory chips, each of which includes a plurality of planes suitable for storing data, a plurality of page buffers respectively corresponding to the planes, and a write buffer, the method comprising:
transferring write data stored in the write buffer to a first page buffer of a first chip;
deleting the write data stored in the write buffer for release of the write buffer and a first plane corresponding to the first page buffer in the first chip after the transfer to the first page buffer; and
programming the write data in the first plane after the release from the first plane.

12. The method according to claim 11, further comprising when the programming in the first chip fails:
rejoining the write buffer and the first plane; and
transferring the write data to a second buffer of a second chip.

13. The method according to claim 12, further comprising:
deleting the write data stored in the write buffer for release of the write buffer and a second plane corresponding to the second page buffer in the second chip after the transfer to the second page buffer; and
programming the write data in the second plane after the release from the second plane.

14. The method according to claim 11, wherein the first plane includes a least significant bit (LSB) plane and a most significant bit (MSB) plane.

15. The method according to claim 11, wherein the programming is performed through one or more of a one shot program, a multi-plane program and a one plane program.

16. A method for operating a memory system including a plurality of memory chips, each of which includes a plurality of planes suitable for storing data, a plurality of page buffers respectively corresponding to the planes, and a write buffer, the method comprising:
sequentially transferring a plurality of data chunks, which are included in the write data and respectively stored in corresponding regions of the write buffer, to a first page buffer of a first chip;
deleting the data chunks respectively stored in the corresponding regions of the write buffer for release of the corresponding regions of the write buffer and a first plane corresponding the first page buffer in the first chip after each transfer of the plural data chunks to the first page buffer; and
programming the write data in the first plane after the release from the first plane.

17. The method according to claim 16, further comprising when the programming a first data chunk in the first chip fails:
rejoining the first plane and a first region of the write buffer corresponding to the first data chunk; and
transferring the first data chunk to a second page buffer of a second chip.

18. The method according to claim 17, further comprising:
deleting the first data chunk stored in the first region for release of the first region and a second plane corresponding to the second page buffer in the second chip after the transfer of the first data chunk to the second page buffer; and
programming the first data chunk in the second plane after the release of the first region from the second plane.

19. The method according to claim 16, wherein the first plane includes a least significant bit (LSB) plane and a most significant bit (MSB) plane.

20. The method according to claim 16, wherein the programming is performed through one or more of a one shot program, a multi-plane program and a one plane program.

* * * * *